United States Patent
Sinha et al.

(10) Patent No.: US 9,408,334 B2
(45) Date of Patent: Aug. 2, 2016

(54) ELECTRONIC DEVICE WITH COMPONENT SHIELDING STRUCTURES AND INPUT-OUTPUT CONNECTORS

(71) Applicant: Apple Inc., Cupertino, CA (US)

(72) Inventors: Vikas K. Sinha, Redwood City, CA (US); Phillip S. Satterfield, Oakland, CA (US); Vinh H. Diep, Palo Alto, CA (US); Daniele De Iuliis, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 509 days.

(21) Appl. No.: 13/874,164

(22) Filed: Apr. 30, 2013

(65) Prior Publication Data

US 2014/0321045 A1    Oct. 30, 2014

(51) Int. Cl.
*H05K 9/00* (2006.01)
*G06F 1/18* (2006.01)
(Continued)

(52) U.S. Cl.
CPC ............ *H05K 9/0015* (2013.01); *G06F 1/1656* (2013.01); *G06F 1/182* (2013.01); *G06F 1/187* (2013.01); *G11B 33/08* (2013.01); *G11B 33/124* (2013.01); *G11B 33/1493* (2013.01); *H05K 9/003* (2013.01); *H05K 9/0007* (2013.01); *H05K 9/0043* (2013.01)

(58) Field of Classification Search
CPC ....... H05K 9/00; H05K 9/0009; G11B 33/08; G06F 1/187
USPC .......... 361/818, 816, 679.33, 679.34, 679.35, 361/679.36, 679.37; 174/350, 358, 367, 174/370, 439, 197, 259, 607, 609
See application file for complete search history.

(56) References Cited

U.S. PATENT DOCUMENTS

| 5,227,929 A | 7/1993 | Comerford |
| 5,704,212 A | 1/1998 | Erler et al. |

(Continued)

FOREIGN PATENT DOCUMENTS

| EP | 0655882 | 5/1995 |
| EP | 1884952 | 2/2008 |
| WO | 0047029 | 8/2000 |

OTHER PUBLICATIONS

Sinha et al., U.S. Appl. No. 13/874,260, filed Apr. 30, 2013.
(Continued)

*Primary Examiner* — Jenny L Wagner
*Assistant Examiner* — Michael P McFadden
(74) *Attorney, Agent, or Firm* — Treyz Law Group, P.C.; G. Victor Treyz; Zachary D. Hadd

(57) ABSTRACT

An electronic device may have a hard disk drive mounted diagonally within a housing. Electromagnetic interference shielding structures may enclose the hard disk drive. The shielding structures may include conductive elastomeric structures. A printed circuit board may be mounted diagonally in parallel with the hard disk drive. Connectors on the printed circuit board may be angled away from the printed circuit board at a non-zero angle and may be retained against the housing with a slide and lock connector retention member. An accelerometer may detect when the device is tipped over so that control circuitry may protect the hard disk drive. A fan may cause air to flow upwards on one side of the device and downwards on the other side of the device. The housing may rest on housing support structures with angled air vents and integral elastomeric feet.

11 Claims, 22 Drawing Sheets

(51) Int. Cl.
G11B 33/08 (2006.01)
G11B 33/12 (2006.01)
G11B 33/14 (2006.01)
G06F 1/16 (2006.01)

(56) References Cited

U.S. PATENT DOCUMENTS

| | | | |
|---|---|---|---|
| 5,847,938 A | 12/1998 | Gammon | |
| 6,019,609 A | 2/2000 | Strange | |
| 8,000,100 B2 | 8/2011 | Kao et al. | |
| 8,029,300 B2 | 10/2011 | Finney et al. | |
| 8,164,849 B1 | 4/2012 | Szeremeta et al. | |
| 8,175,837 B2 | 5/2012 | Mukai et al. | |
| 2004/0070926 A1* | 4/2004 | Boykin | G11B 25/043 361/679.33 |
| 2005/0152106 A1* | 7/2005 | Coster | G06F 1/181 361/679.58 |
| 2006/0193113 A1 | 8/2006 | Cohen et al. | |
| 2007/0030646 A1 | 2/2007 | Hsu | |
| 2007/0159710 A1 | 7/2007 | Lucas et al. | |
| 2007/0183128 A1 | 8/2007 | Pirillis et al. | |
| 2009/0291608 A1 | 11/2009 | Choi et al. | |
| 2010/0051243 A1 | 3/2010 | Ali et al. | |
| 2011/0149502 A1 | 6/2011 | Tan et al. | |
| 2012/0182188 A1 | 7/2012 | Gu et al. | |
| 2012/0327598 A1 | 12/2012 | Nakayama | |

OTHER PUBLICATIONS

Shiu et al., U.S. Appl. No. 13/780,787, filed Feb. 28, 2013.

* cited by examiner

150 # ELECTRONIC DEVICE WITH COMPONENT SHIELDING STRUCTURES AND INPUT-OUTPUT CONNECTORS

BACKGROUND

This relates generally to electronic devices, and more particularly, electronic devices with features for managing heat, input-output connections, and electromagnetic interference.

Electronic devices are often provided with storage such as hard disk drive storage. Wireless circuitry is used to transmit and receive radio-frequency signals. Heat sink structures are used to help dissipate heat. Input-output ports in the electronic devices are coupled to input-output connectors.

It can be challenging to form electronic devices with features such as these. If care is not taken, electromagnetic interference may degrade wireless performance. Sensitive components such as hard disk drives may be susceptible to damage from impact events. Heat sink structures may have difficulty removing heat efficiently. Input-output connectors may not be satisfactorily integrated into a device. Problems such as these can be exacerbated in devices that are designed to have a compact size and pleasing aesthetics.

It would therefore be desirable to be able to provide improved electronic devices.

SUMMARY

An electronic device such as a wireless router may have a box-shaped housing. The housing may be taller than it is wide. An electronic component such as a hard disk drive may be mounted diagonally within the housing so as to extend between diagonally opposing edges that run vertically along the housing. The hard disk drive may be mounted vertically so that its longer dimension runs parallel to the vertically extending edges of the housing. Control circuitry may protect the hard disk drive by parking a read-write head in the hard drive or taking other suitable action when an accelerometer in the device detects that the device has been tipped over.

Electromagnetic interference shielding structures may enclose the hard disk drive. Conductive elastomeric structures in the shielding structures may reduce vibrations and protect the drive during impact events. The conductive elastomeric structures may form upper and lower bumper structures that are respectively mounted above and below the hard disk drive. The electromagnetic interference shielding structures may have a metal bracket. The metal bracket may have a U-shape that forms three sides of a six-sided conductive shielding box for the hard disk drive. The upper and lower bumper structures may form upper and lower sides for the shielding box. End shields formed from curved sheet metal may mate with rounded ends in the conductive elastomeric structures and may be joined to vertically extending edges in the metal bracket using conductive gaskets.

A printed circuit board may be mounted diagonally in parallel with the hard disk drive. Connectors on the printed circuit board may be angled away from the printed circuit board at a non-zero angle. A connector retention member may hold the connectors in place, so that surfaces of the connectors lie flush with the housing.

A fan may cause air to flow upwards on one side of the device and downwards on the other side of the device. The printed circuit board may have components and heat sink structures that are cooled by vertically flowing air. A power supply may be mounted on an opposing side of the hard disk drive and may receive downwardly flowing air.

The housing may rest on housing support structures. The housing support structures may have angled air vents and integral elastomeric feet.

Further features, their nature and various advantages will be more apparent from the accompanying drawings and the following detailed description of the preferred embodiments.

DETAILED DESCRIPTION

Figure 1:
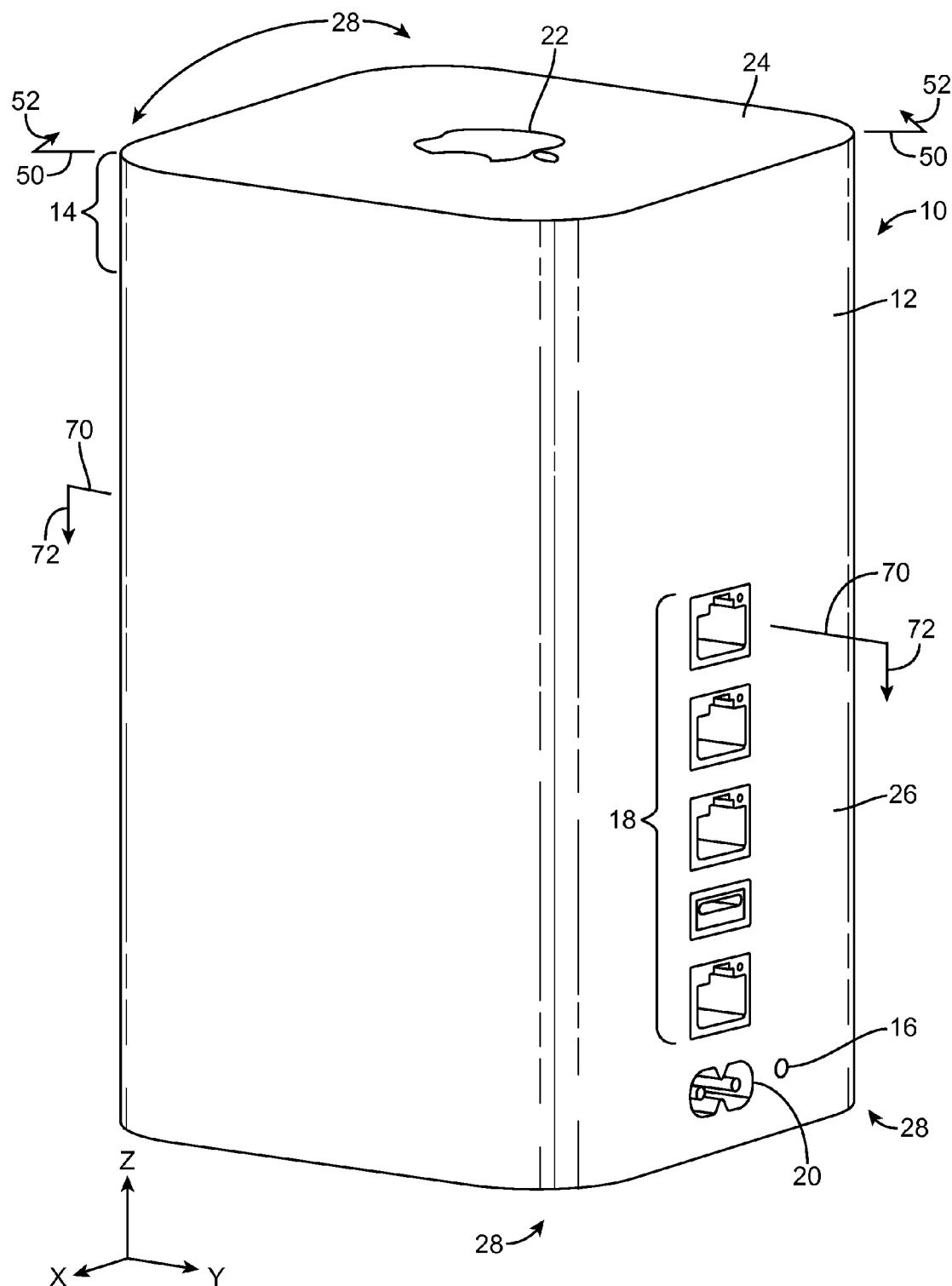
FIG. 1 is a perspective view of an illustrative electronic device having a device housing in accordance with an embodiment.

An electronic device such as electronic device 10 of FIG. 1 may be provided with wireless communications capabilities, input-output ports for coupling to external connectors, heat sinking structures and fan structures for cooling electrical components, hard disk drives and other storage devices, electromagnetic shielding structures to help prevent electromagnetic interference from disrupting device operation, and other structures for enhancing the performance and appearance of the device. Electronic device 10 may be a wireless electronic device such as a wireless router or other suitable electronic device. For example, electronic device 10 may be a portable device such as a laptop computer, a tablet computer, a somewhat smaller device such as a wrist-watch device, pendant device, headphone device, earpiece device, or other wearable or miniature device, a cellular telephone, or a media player. Device 10 may also be a television, a set-top box, a desktop computer, a computer monitor into which a computer has been integrated, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may include wireless communications circuitry. The wireless communications circuitry may include one or more antennas. For example, one or more antennas for device 10 may be located in upper region 14 of device 10 under the top surface of housing 12 above a hard drive and other internal components. The portion of housing 12 that covers the antenna structures in region 14 may be formed from a dielectric such as plastic. This allows antenna signals to be transmitted through housing 12 and to be received through housing 12.

Antennas in region 14 may be formed using any suitable antenna types. For example, antennas in region 14 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link.

Device 10 may have openings such as opening 16 to accommodate one or more buttons or status indicator lights, openings such as openings 18 that are associated with input-output ports, and an opening such as opening 20 that is associated with a power port. Input-output ports 18 may include Ethernet ports formed from Ethernet connectors, Universal Serial Bus (USB) ports formed from USB connectors, analog signal ports, digital signal ports, or other input-output ports. Power ports such as power port 20 can receive an alternating current (AC) or direct current (DC) connector.

Input-output ports 18 and power port 20 may be formed on rear housing wall 26 or elsewhere in device 10. Status indicator light openings or openings for buttons such as opening 16 may also be formed on rear housing wall 26 or other surfaces of housing 12 (e.g., a front housing wall, etc.). Device 10 may have a rectangular box shape of the type shown in FIG. 1 in which the height of the device in vertical dimension Z is greater than the lateral size (width) of the device in lateral dimensions X and Y. The footprint of device 10 may be rectangular (e.g., square). If desired, device 10 may have other suitable shapes (e.g., shapes with circular footprints, shapes with oval foot prints, shapes with heights that are the same as or less than the lateral dimensions of the housing, etc.). The configuration of FIG. 1 is merely illustrative.

Device housing 12 may have vertical edges formed from sidewalls that meet at right angles or may, as shown in FIG. 1, have curved edges 28. Curved edges 28 may extend vertically along four respective corners of housing 12, so curved edges 28 may sometimes be referred to as rounded or curved corners in housing 12. Housing 12 may have a rectangular footprint such as a square footprint with four respective corners. Curved edges 28 may extend vertically along each of the four corners. One or more logos or other information may be provided on the surface of housing 12. For example, logo 22 may be provided on rectangular (e.g., square) top surface 24 of housing 12.

Figure 2:
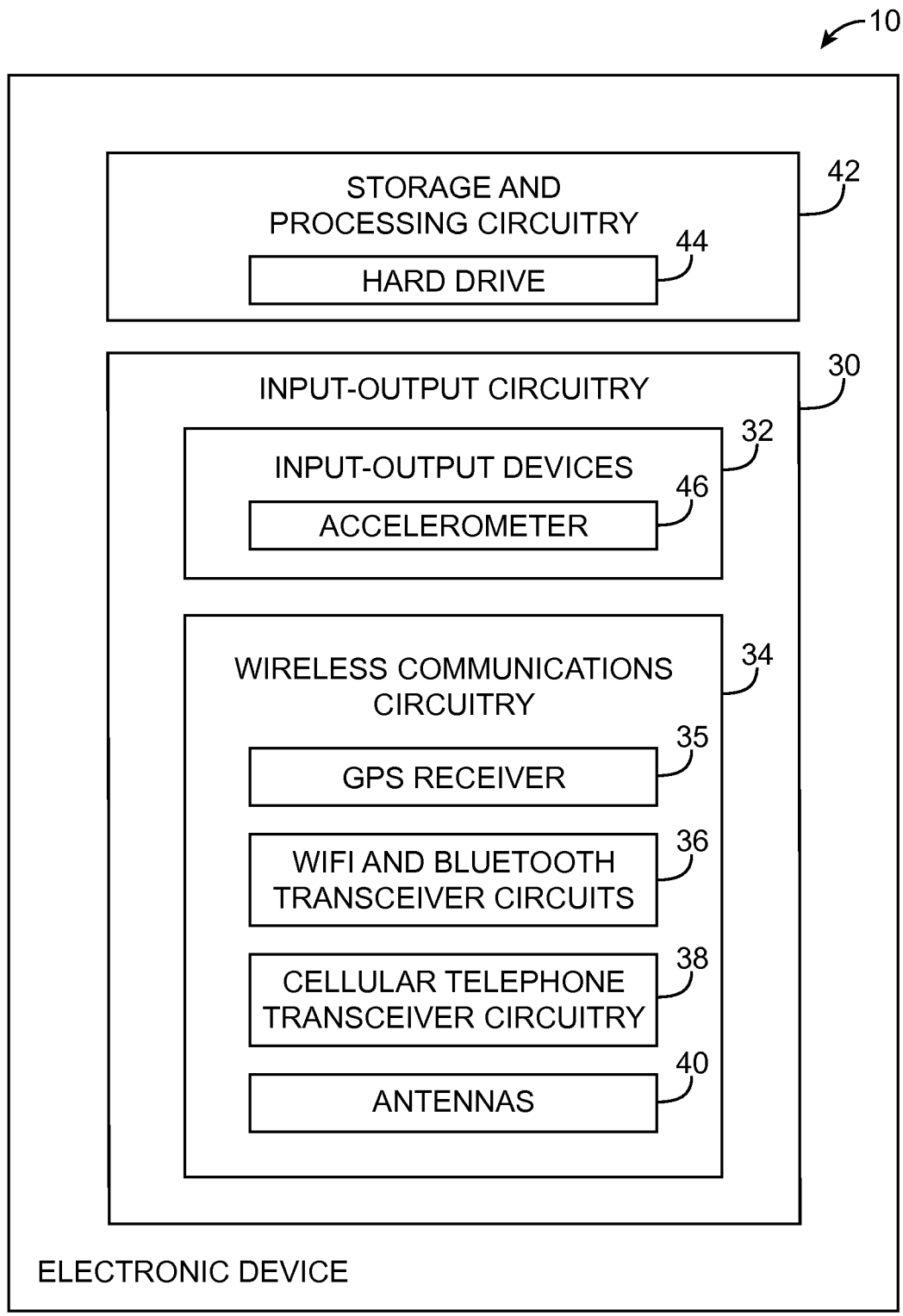
FIG. 2 is a schematic diagram of an illustrative electronic device in accordance with an embodiment.

A schematic diagram of an illustrative configuration that may be used for electronic device 10 is shown in FIG. 2. As shown in FIG. 2, electronic device 10 may include control circuitry such as storage and processing circuitry 42. Storage and processing circuitry 42 may include a bulk storage device such as hard disk drive storage (e.g., hard drive 44) or other storage drive (e.g., a solid state drive, an array of drives, etc.), nonvolatile memory (e.g., flash memory or other electrically-programmable-read-only memory configured to form a solid state drive), volatile memory (e.g., static or dynamic random-access-memory), etc. Processing circuitry in storage and processing circuitry 42 may be used to control the operation of device 10. The processing circuitry may be based on one or more microprocessors, microcontrollers, digital signal processors, baseband processors, power management units, audio codec chips, application specific integrated circuits, etc.

Storage and processing circuitry 42 may be used to run software on device 10, such as voice-over-internet-protocol (VOIP) telephone call applications, email applications, media playback applications, operating system functions, file backup software, software for supporting router and access point functions, software for supplying status information to a user (e.g., by controlling the operation of status indicator lights), software for implementing hard drive read/write head parking functions or other disk protection functions based on accelerometer data indicating that device 10 is tipping over, etc. To support interactions with external equipment, storage and processing circuitry 42 may be used in implementing communications protocols. Communications protocols that may be implemented using storage and processing circuitry 42 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Input-output circuitry 30 may be used to allow data to be supplied to device 10 and to allow data to be provided from device 10 to external devices. Input-output circuitry 30 may include input-output devices 32. Input-output devices 32 may include touch screens and other displays, buttons (e.g., button 16, which may serve as a reset button), joysticks, click wheels, scrolling wheels, touch pads, key pads, keyboards, microphones, speakers, tone generators, vibrators, cameras, sensors such as accelerometer 46, light-emitting diodes and other status indicators, data ports (e.g., ports 18), etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Wireless communications circuitry 34 may include satellite navigation system receiver circuitry such as Global Positioning System (GPS) receiver circuitry 35. Transceiver circuitry 36 may handle wireless local area network communications. For example, transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link. Antennas 40 may be mounted in upper region 14 of housing 12 under the top wall formed by housing 12 to allow antennas 40 to operate without interference from intervening electronic components in device 10.

Figure 3:
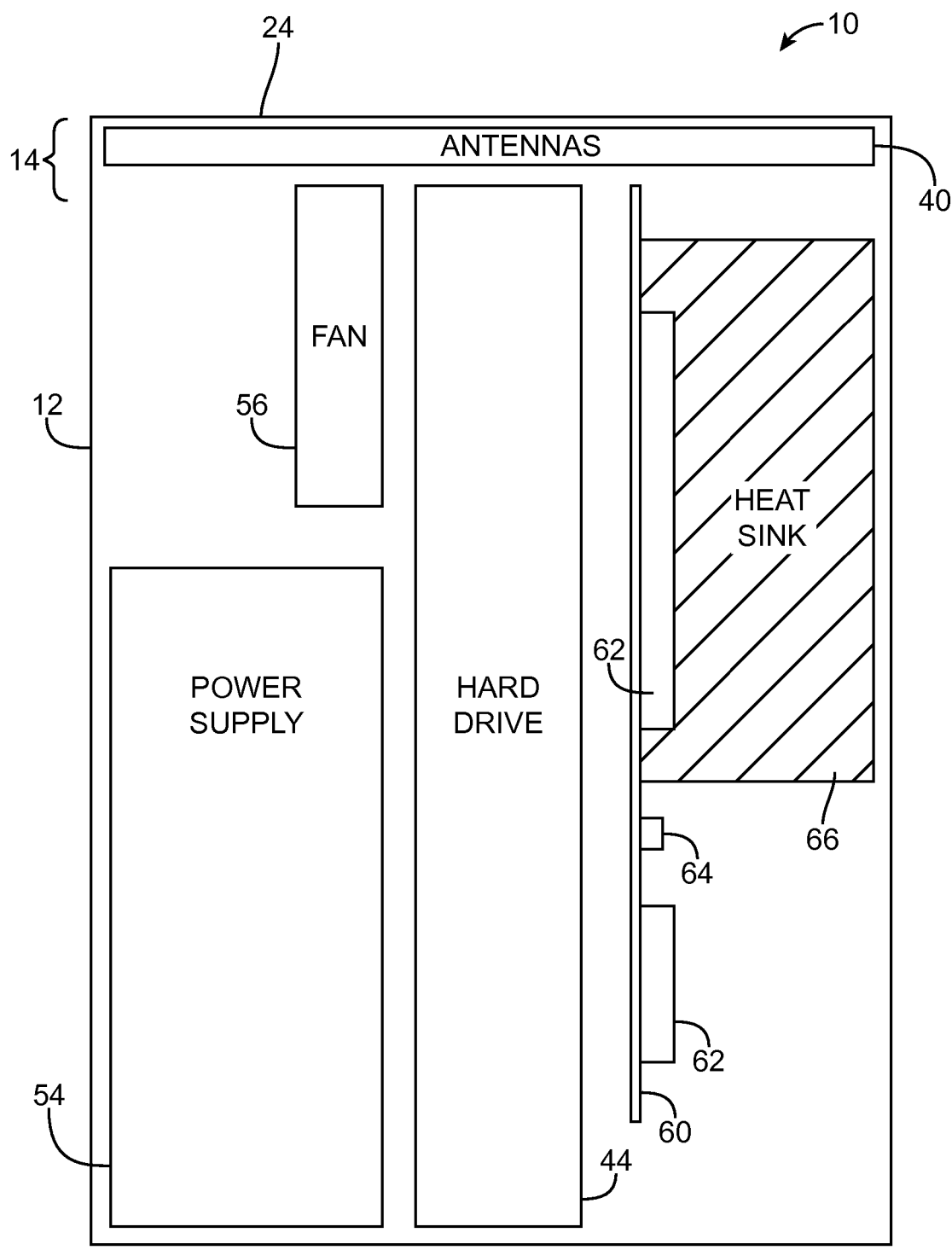
FIG. 3 is a cross-sectional side view of an illustrative electronic device in accordance with an embodiment.

FIG. 3 is a cross-sectional side view of device 10 taken along line 50 of FIG. 1 and viewed in direction 52. As shown in FIG. 3, antennas 40 may be located in region 14 at the top of device 10 above hard disk drive 44 and may lie in a plane parallel to the plane of upper housing surface 24. In this configuration, antennas 40 may operate without being blocked by the potentially conductive structures of internal device components. A storage device such as hard disk drive 44 or other electrical component may run diagonally across device housing 12 between diagonally opposed housing edges (i.e., hard disk drive 44 may lie within a plane that runs into and out of the page in the orientation of FIG. 3).

Power supply 54 may be used to convert alternating current from a wall outlet or other source of alternating current to direct current power. The direct current output from power supply 54 may be used to power hard disk drive 44 and other electrical components within the interior of device housing 12.

Device 10 may contain one or more printed circuits such as one or more rigid printed circuit boards (e.g., printed circuit boards formed from fiberglass-filled epoxy or other rigid printed circuit board material) and, if desired, one or more flexible printed circuits (e.g., printed circuits formed from a polyimide substrate or other layer of flexible polymer). For example, device 10 may contain printed circuit board 60. Components such as components 62 and 64 may be mounted on printed circuit board 60. Components 62 may be, for example, integrated circuits, connectors, switches, application specific integrated circuits, processors, memory (see, e.g., circuitry 42 of FIG. 2), input-output components such as circuitry 30, communications circuits (e.g., wired communications circuits and wireless communications circuitry 34), and other circuitry for supporting the operation of device 10.

Component 64 may be a sensor such as an accelerometer. Accelerometer 64 may detect when device 10 is about to tip over or otherwise experience an unexpected movement (e.g., by detecting an impact, by detecting a period of weightlessness associated with a drop event, etc.). In response, control circuitry 42 can park the read-write head of hard drive 44 or take other action to protect drive 44 in advance of shock from an impact. By parking the head of drive 44 or taking other protective action, damage to drive 44 and the potential for associated data loss in drive 44 may be minimized.

Hard drive 44 may have a rectangular shape with a shorter lateral dimension (width) and a longer lateral dimension (length). The longer dimension of hard drive 44 may be aligned with vertical dimension Z to help minimize the footprint of device 10. The diagonally mounted configuration of hard drive 44 may also help minimize the footprint of device 10, because diagonal mounting in which hard drive 44 runs between two edges (corners) of housing 12 that are diagonally across from each other allows the width of hard drive 44 to be accommodated in the widest portion of device housing 12 (i.e., its diagonal dimension). Although use of a vertical orientation for mounting hard drive 44 may help reduce the surface area of upper surface 24 and the corresponding footprint (outline) of device housing 12 when viewed from above in downward vertical direction −Z, the use of the vertical orientation for hard drive 44 may make device 10 more prone to tipping over than other devices. By incorporating automatic accelerometer-based read-write head parking capabilities into device 10, drive 44 can be protected from unexpected damage in the event that device 10 is knocked over during use.

Device 10 may contain one or more heat sinks such as heat sink structures 66. Heat sink structures 66 in device 10 may be formed from a material with a high thermal conductivity such as metal and may have fins or other features that help increase the surface area of the heat sink structures to promote heat transfer to the surrounding environment. Heat sink structures 66 may be attached to one or more components 62 on printed circuit board 60 to cool components 62. Components 62 may, if desired, be enclosed in radio-frequency shielding cans. Heat sink structures 66 may be mounted on the exposed surfaces of the radio-frequency shielding cans, may be mounted on the surfaces of integrated circuits without shields, or may be mounted adjacent to other components that generate heat.

Fan 56 may be used to draw air into the interior of device 10 through air vents formed in housing 12. The air that is drawn into housing 12 may pass over heat sink structures 66 to remove heat from heat sink structures 66. Air flow may also be used to cool components such as hard drive 44 and power supply 54.

Figure 4:
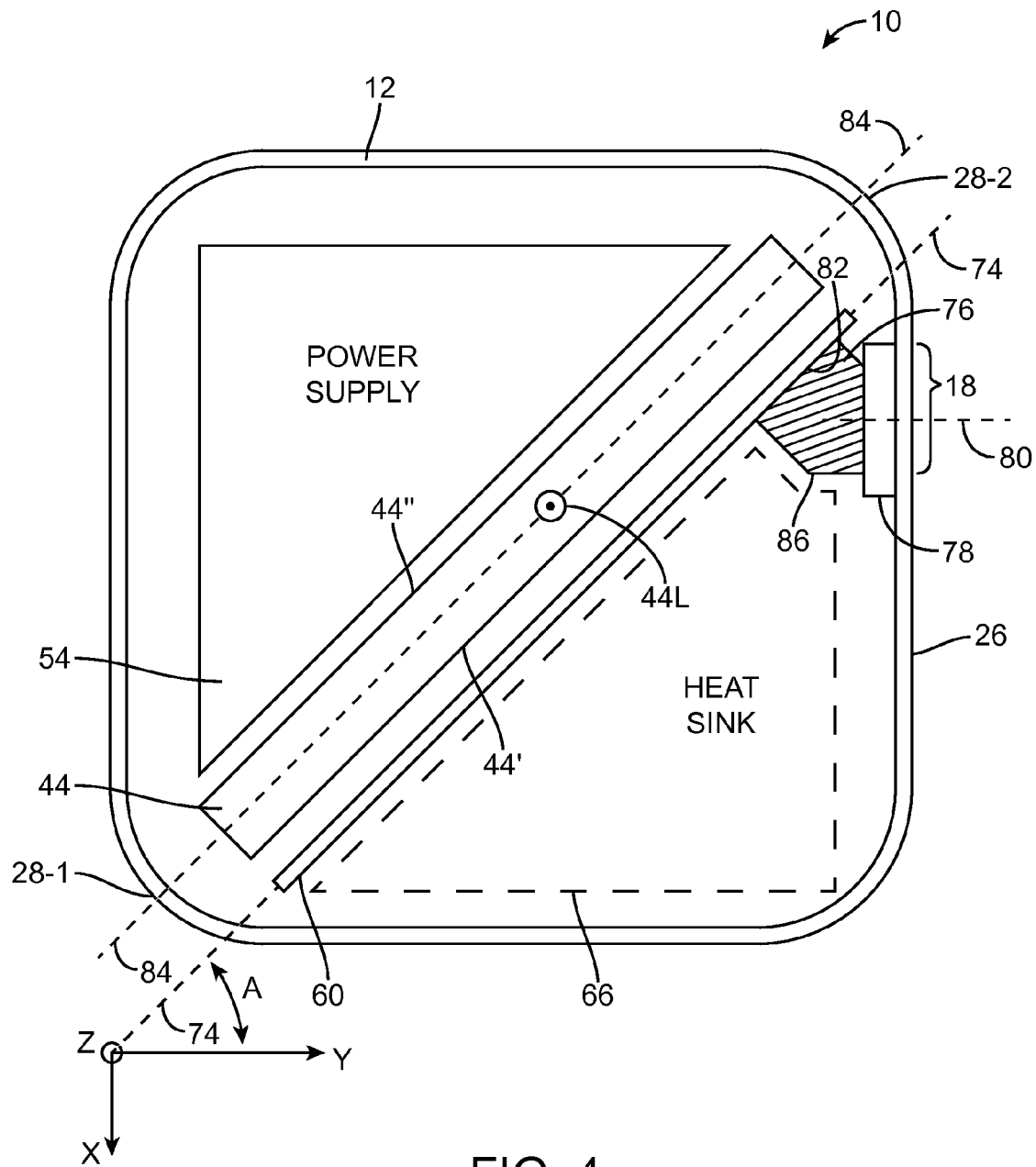
FIG. 4 is a cross-sectional top view of an illustrative electronic device in accordance with an embodiment.

FIG. 4 is a cross-sectional view of device 10 taken along line 70 of FIG. 1 and viewed in direction 72. As shown in FIG. 4, hard disk drive 44 may have a planar shape that is oriented so as to be parallel to diagonal plane 84. Diagonal plane 84 runs diagonally across device 10 between diagonally opposed vertically extending edges (corners) 28-1 and 28-2 of housing 12. Hard disk drive 44 lies within plane 84 (i.e., hard disk drive is oriented diagonally with respect to lateral dimensions X and Y of FIG. 4).

In a configuration of the type shown in FIG. 4 in which the sidewalls of housing 12 are of equal size and the rectangular footprint of device 10 is square, plane 84 and parallel plane 74 of printed circuit 60 are oriented parallel to one another at an angle A of 45° with respect to lateral dimension Y. By orienting hard disk drive 44 diagonally between the opposing vertical edges of housing 12 and by orienting hard disk drive 44 so that its longitudinal axis 44L runs vertically, parallel to vertical dimension Z, the lateral dimensions of each of the sidewalls of box-shaped housing 12 (i.e., the dimensions of housing 12 in the X-Y plane of FIG. 4) may be minimized while maximizing the size of hard disk drive 44.

Connector port 18 has one or more connectors such as connector 76. Connector 76 in the example of FIG. 4 is an Ethernet connector. Other types of connector may be used in implementing connectors such as connector 76, if desired. The configuration of FIG. 4 is merely illustrative.

As shown in FIG. 4, connector 76 may have an axis such as axis 80 along which plugs and other connectors may be moved when it is desired to insert a connector into the opening formed by port 18 and connector 76. Plug insertion axis 80 (i.e., the plug reception axis for connector 76) may be oriented perpendicular to rear wall 26 (i.e., axis 80 may form a surface normal for the plane of rear housing wall 26 and may run parallel to the Y axis). Because printed circuit board 60 is diagonally mounted within housing 12 and lies at an angle A of 45° with respect to axis Y, connector 76 preferably has a bend such as bend 86. This allows connector mounting surface 82 to be oriented at an angle of 45° with respect to plug insertion axis 80. In this configuration, connector surface 82 lies flush with the surface of diagonally mounted printed circuit 60. Each of connectors 76 may be provided with a bend such as bend 86, so that the mounting surfaces of these connectors can all be mounted to printed circuit 60. Solder joints or other attachment mechanisms may be used for attaching connector 76 to printed circuit 60.

Hard disk drive 44 may have opposing planar surfaces 44' and 44". Power supply 54 and fan 56 may be mounted on one side of hard disk drive 44 (e.g., on the side of hard disk drive 44 that faces surface 44") and heat sink structures 66, printed circuit board 60, and components 62 and 64 may be mounted on an opposing side of hard disk drive 44 (e.g., on the side of hard disk drive 44 that faces surface 44').

It may be desirable to insert interior components such as power supply 54 and heat sink structures 66 into the interior of housing 12 along the vertical axis of housing 12 (i.e., along vertical dimension Z). Once installed, connectors 76 may engage with sidewall features such as connector retention features. The connector retention features may be implemented as a metal or plastic connector retention member attached to wall 26, may be implemented as an integral portion of wall 26, may be implemented both using structures that are attached to wall 26 and structures that are formed as an integral portion of wall 26, or may be implemented using other connector retention structures. As an example, connectors 76 can have rear-facing surfaces that are held flush against rear housing wall 26 using a connection retention member such as connector retention member 78 of FIG. 4. Connector retention member 78 may be attached to rear housing sidewall 26 using adhesive, heat stakes formed as integral portions of rear housing wall 26, screws or other fasteners, or other attachment mechanisms.

Figure 5:
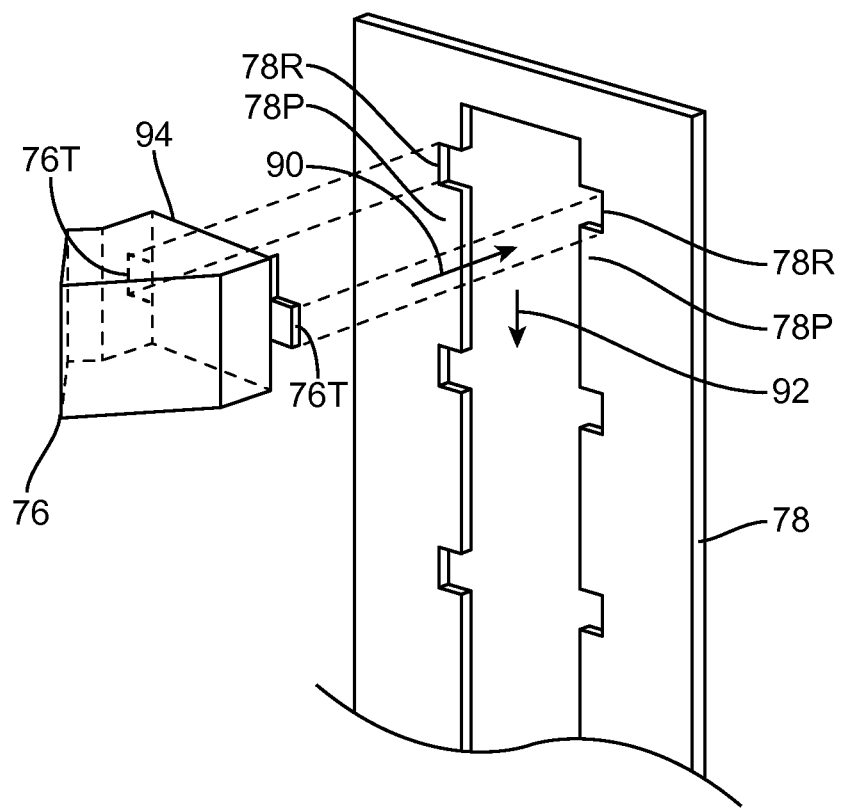
FIG. 5 is a perspective view of a portion of an input-output connector retention member of the type that may be used in an electronic device in accordance with an embodiment.

Connectors in device 10 and connector retention member 78 may have interlocking features. As shown in FIG. 5, for example, connector 76 may have protrusions such as tabs 76T that extend laterally outwards from the edges of the rear surface of connector 76. Connector retention member 78 may have corresponding recesses 78R that are configured to receive tabs 76T when connector 76 is moved in direction 90. After tabs 76T have been received within recesses 78R, connector 76 may be moved downwards in direction 92. This causes tabs 76T to slide behind tab retention portions 78P of connector retention member 78.

Figure 6:
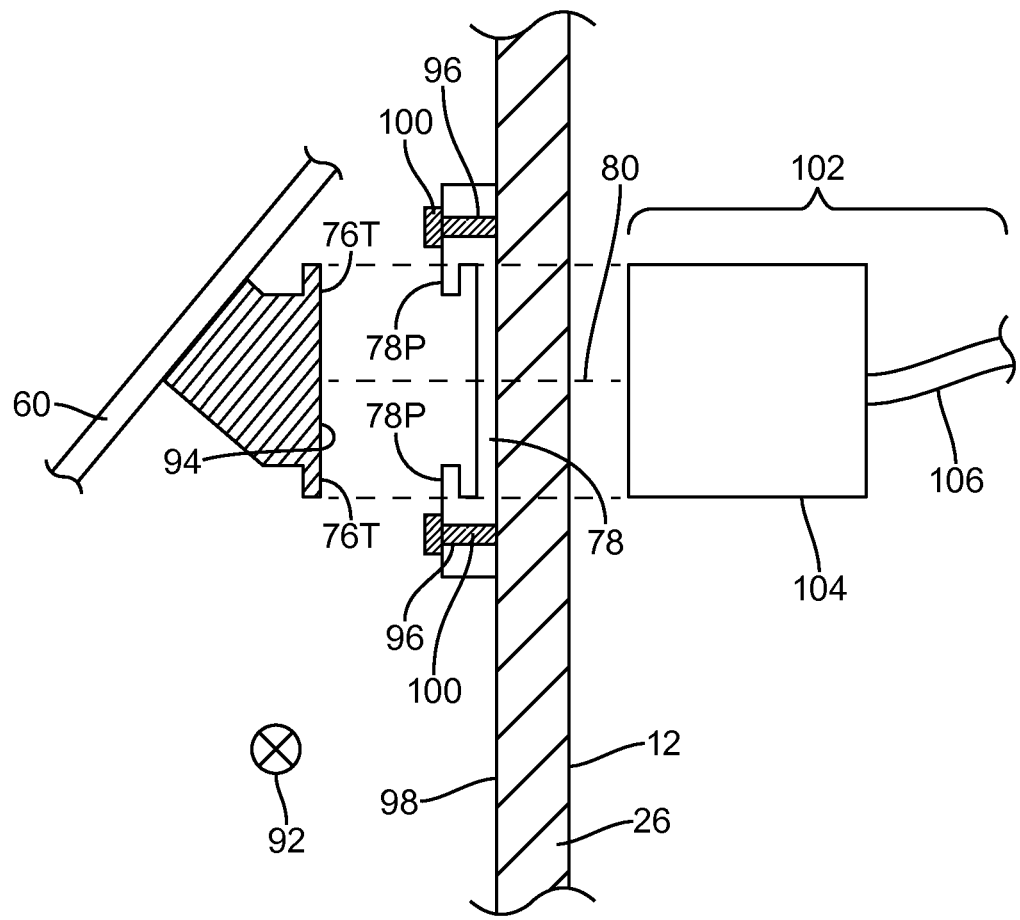
FIG. 6 is an exploded top view of an input-output connector, an input-output connector retention member mounted to an inner surface of an electronic device housing wall, and a mating input-output connector such as a plug on a cable in accordance with an embodiment.

FIG. 6 is a top exploded view of a connector such as connector 76 that has been mounted to printed circuit board 60 during installation of connector 76 into device 10 using connector retention member 78. As shown in FIG. 6, heat stakes 100 that are formed as an integral portion of housing wall 26 may pass through openings 96 in connector retention member 78 to attach connector retention member 78 to inner surface 98 of rear housing wall 26.

During assembly, tabs 76T of connector 76 may be inserted through notch-shaped openings or other recesses in member 78 such as notches 78R of FIG. 5. Following movement of connector 76 downwards in direction 92 (into the page in the orientation of FIG. 6), portions 78P of connector retention member will hold connector 76 and printed circuit board 60 in place so that surface 94 of connector 76 is mounted against housing wall 26 of housing 12.

In this configuration, connector retention member 78 will hold outer surface 94 of connector 76 flush against inner surface 98 of rear housing wall 26. During operation of device 10, a user may insert a connector such as an Ethernet plug or other connector 104 into connector 76 along connector insertion axis 80 (FIG. 4). Connector 104 may, for example, be part of an Ethernet cable or other cable 102 that has a pigtailed length of cable such as cable 106. Due to the presence of tab retention structures 78P, the insertion of plug 104 along connector insertion axis 80 into connector 76 will not dislodge connector 76 from rear housing wall 26.

Figure 7:
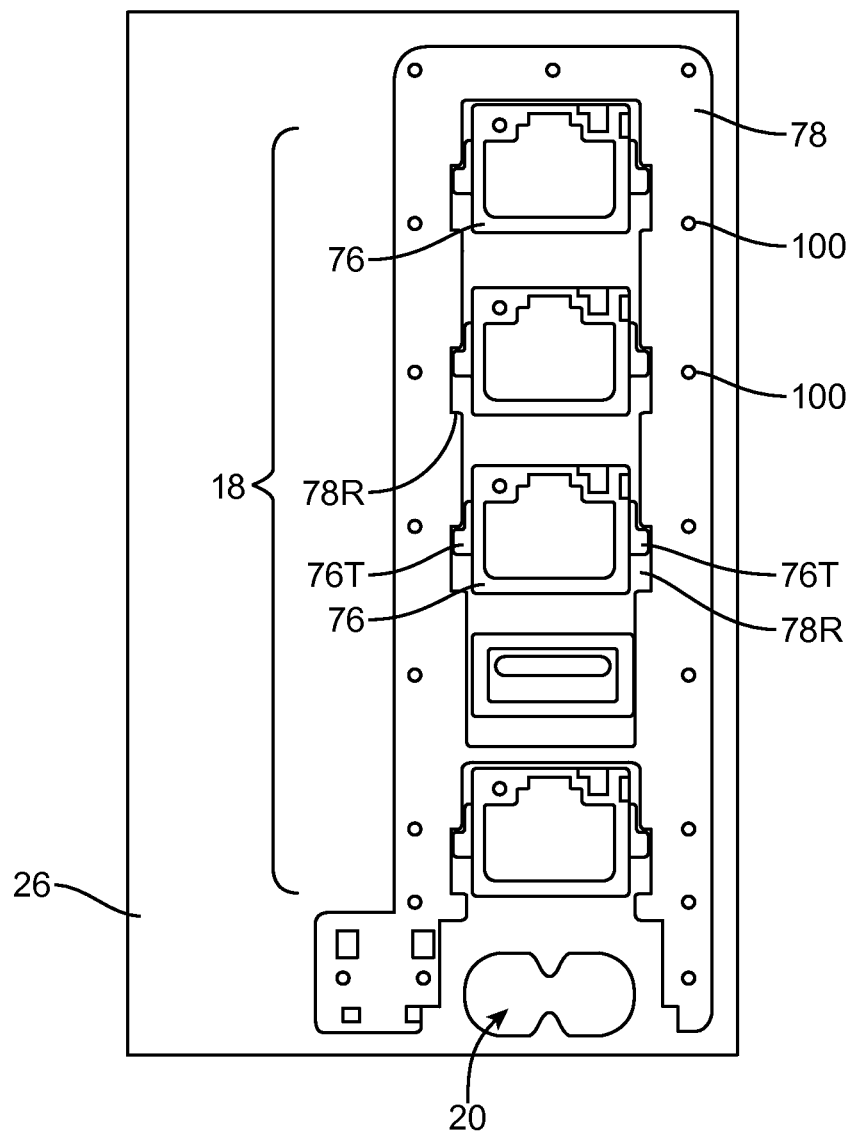
FIG. 7 is an interior view of an input-output connector retention member mounted to an inner surface of an electronic device housing wall in accordance with an embodiment.

Because connectors such as connector 76 slide in direction 92 in order to lock the connectors in place relative to housing 12, configurations of the type shown in FIG. 5 that have interlocking engagement features on the connectors and housing 12 and/or a connector retention structure such as connector retention member 78 may sometimes be referred to as slide and lock connector retention mechanisms. If desired, other types of connector retention structures can be used. The use of slide and lock connector retention structures to mount connectors 76 to housing wall 26 to form ports 18 is merely illustrative. As shown in FIG. 7, multiple connectors 76 may be mounted to housing wall 26 of housing 12 in device 10 using a single shared connector retention structure 78.

Figure 8:
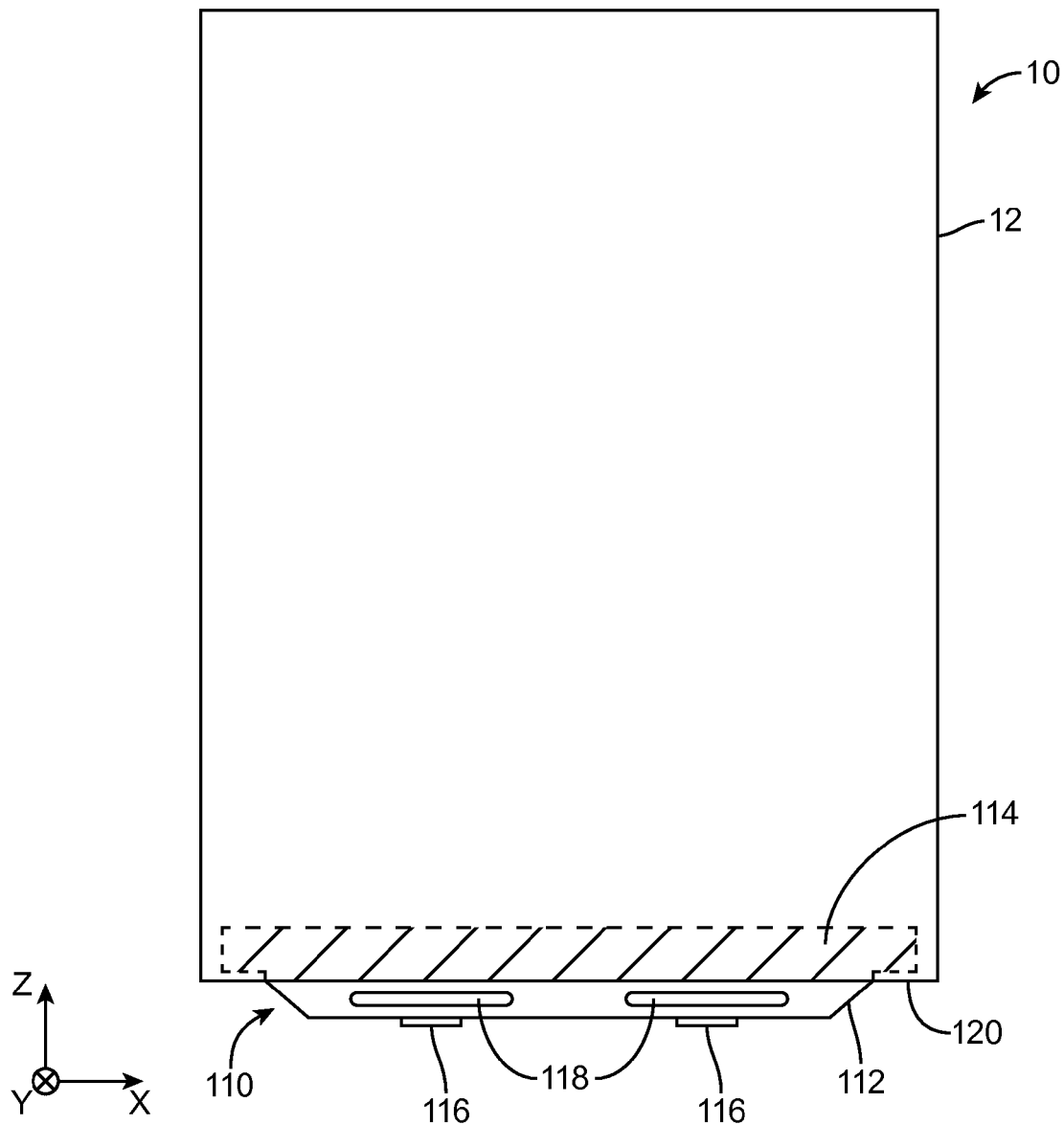
FIG. 8 is a side view of an illustrative electronic device that has air vents for cooling that are formed as part of a housing support structure on a lower surface of the device in accordance with an embodiment.

FIG. 8 is a side view of device 10 showing how the base of device 10 may have a housing support structure with air vents. Housing 12 may rest on housing support structure 110. As shown in FIG. 8, housing support structure 110 may have an inner portion such as portion 114 that is received within the walls of housing 12 and may have an outer portion such as portion 112 that protrudes below lower surface 120 of housing 12. Portions 112 and 114 may be formed from different shots of injection-molded plastic. For example, portion 114 may be formed from a rigid plastic that provides structures 110 with structural strength. Portion 112 may be formed from an elastomeric plastic (i.e., a plastic that is softer and more pliable than plastic 114). Elastomeric housing feet such as feet 116 may be formed as an integral part of elastomeric plastic portion 112 of support structures 110. Hard drive 44 and fan 56 may generate vibrations during operation. The presence of elastomeric material in support structure 110 such as portion 112 and feet 116 may help reduce vibrations and noise that might otherwise arise from vibrations.

Figure 9:
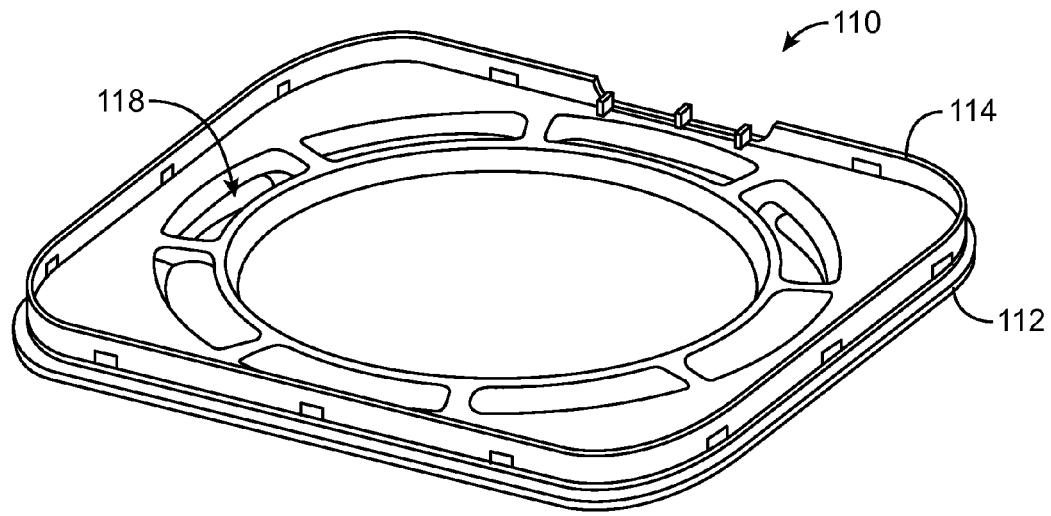
FIG. 9 is a perspective view of a housing support structure for an electronic device showing an inner surface of the housing support structure for the electronic device in accordance with an embodiment.
Figure 10:
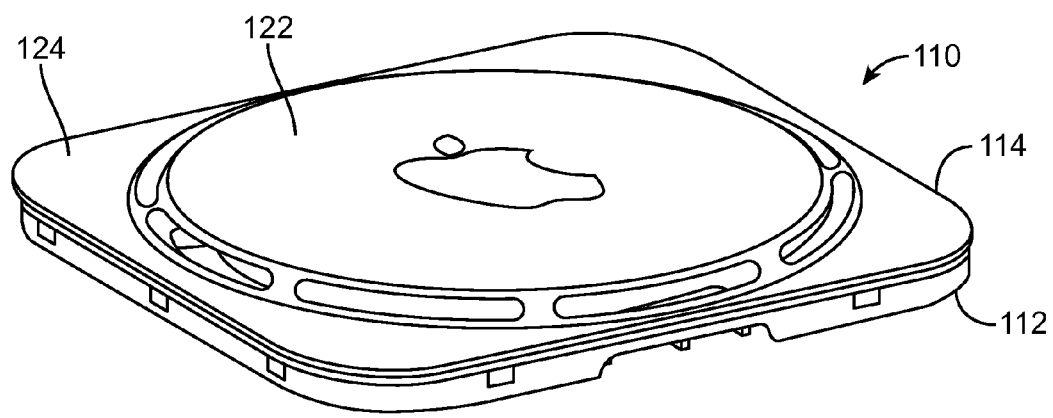
FIG. 10 is a perspective view of a housing support structure for an electronic device showing an outer surface of the housing support structure for the electronic device in accordance with an embodiment.

Housing support structure 110 may have openings such as openings 118. Openings 118 serve as air vents. Air may flow into some of openings 118 while flowing out of other openings 118. There may be two or more air vents 118 in housing support structure 110. As an example, there may be eight air vents 118 that are arranged in a circular shape on support structure 110, as shown in the interior perspective view of housing support structure 110 in FIG. 9. FIG. 10 is an the exterior perspective view of housing support structure 110, showing how air vents 118 may be formed between raised central surface 122 of housing support structure 110 and lower peripheral surface 124 of housing support structure 110.

Figure 11:
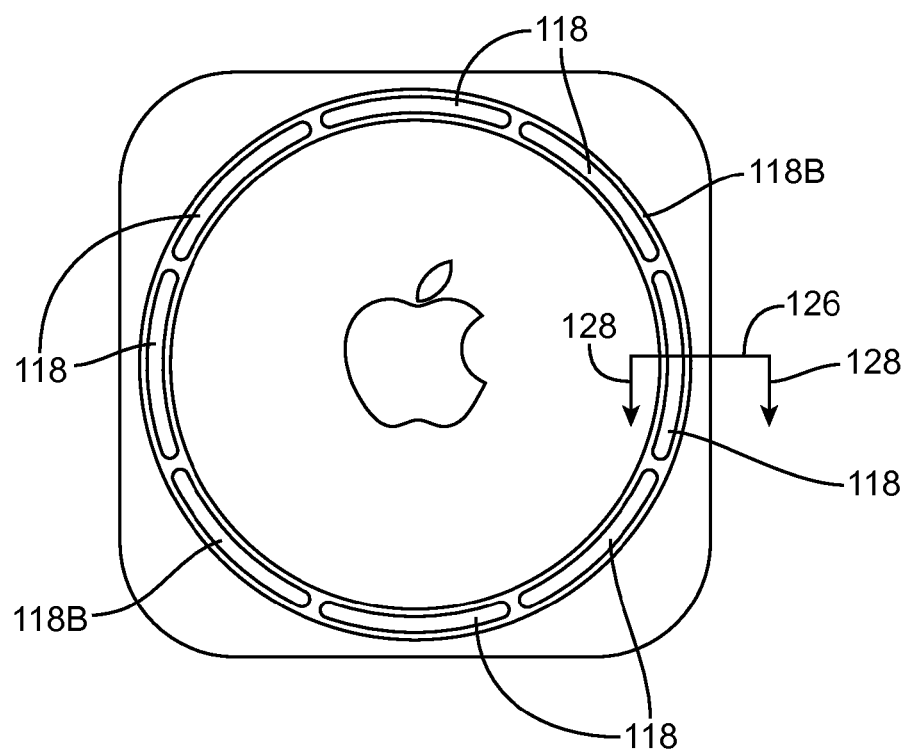
FIG. 11 is a top view of a housing support structure for an electronic device showing an outer surface of the housing support structure with a circle of air vents in accordance with an embodiment.

FIG. 11 is a top perspective view of housing support structure 110. Due to the placement of internal structures in device 10 such as hard disk drive 44, some of the air vents in housing support structure 110 may be fully or partially blocked (i.e., some of air vents 118 may be dummy air vents that are included to ensure that the air vents are arranged in a pleasing symmetrical pattern). As an example, all air vents 118 in housing support structure 110 may be unblocked except blocked air vents 118B.

Figure 12:
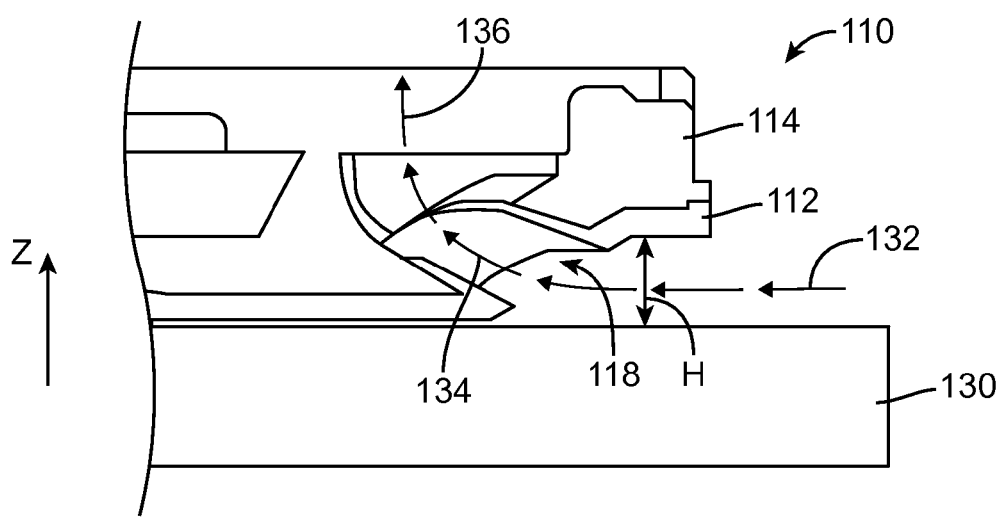
FIG. 12 is a cross-sectional side view of an air vent in a portion of the housing support structure of FIG. 11 in accordance with an embodiment.

FIG. 12 is a cross-sectional side view of housing support structures 110 of FIG. 11 taken along line 126 and viewed in direction 128. In the arrangement of FIG. 12, housing support structure 110 has been attached to the lower portion of housing 12 to support housing 12 and is resting on an external support surface such as table 130. As indicated by horizontal arrow 132, air that is drawn into device 10 may initially flow horizontally across the surface of support structure 130 towards air vent 118. As indicated by angled arrow 134, air may flow through air vent 118 at a non-zero angle with respect to the surface of support structures 130 and vertical dimension Z. Angled arrow 134 is aligned with the main air flow axis of vent 118. After flowing through air vent 118, air flows vertically upwards into the interior of device 10, as indicated by arrow 136. Air outflow vents function in the same way, with air flowing downwards, outwards at a non-zero angle with respect to vertical, and then horizontally away from device 10. With this type of arrangement, air vents 118 form air passageways that are oriented at a non-zero angle with respect to vertical dimension Z so that air flows through the air vents at a non-zero angle with respect to the vertical dimension.

As shown in FIG. 12, there is a vertical spacing H associated with air vents 118. The use of angled air vents (i.e., air vents having air flow axis aligned with an angled axis such as angled arrow 134 of FIG. 12) may help to maximize airflow for a given value of vertical air vent size H. Angled air vents may also help hid internal components from view from the exterior of device 10, thereby enhancing device aesthetics.

Figure 13:
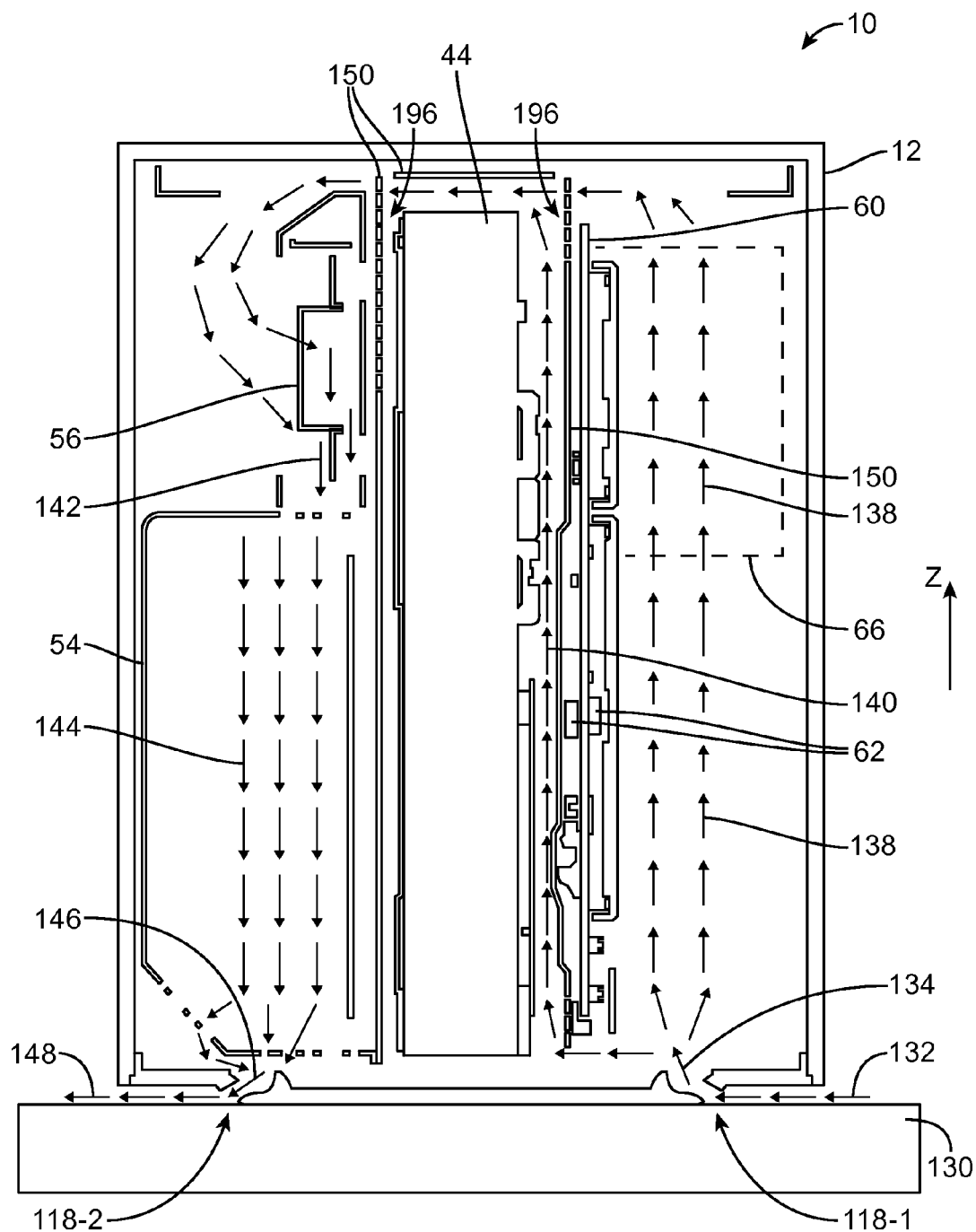
FIG. 13 is a cross-sectional side view of an illustrative electronic device showing how air may flow through the device to cool internal components in accordance with an embodiment.

A cross-sectional side view of device 10 showing how air may flow across components within the interior of housing 12 is shown in FIG. 13. In the side view of device 10 in FIG. 13, two air vents 118 are shown. Air vent 118-1 serves as an air intake vent. Air vent 118-2 serves as an air outlet vent. In general, there may be multiple air inlet vents 118 in device 10 (e.g., two or more, three or more, etc.) and there may be multiple air outlet vents 118 in device 10 (e.g., two or more, three or more, etc.).

As shown by arrow 132, air is drawn towards inlet vent 118-1 horizontally across the surface of external support structure 130. Arrow 134 shows how air flows at a non-zero angle with respect to vertical through the angled inlet formed by air inlet vent 118-1. After entering the interior of housing 12, some air flows vertically upwards through the fins or other heat dissipating structures of heat sink structures 66, as indicated by arrows 138. Air may also be channeled closer to hard disk drive 44. For example, air may flow between printed circuit board 60 and hard disk drive 44 to cool hard disk drive 44, as indicated by arrows 140. After cooling components 62 on printed circuit 60 by removing heat from heat sink structures 66 and after cooling hard disk drive 44, fan (blower) 56 may force air downwards through power supply 54, as indicated by arrows 142 and 144. Air outlet vent 118-2 allows exiting hot air to flow out of housing 12 at a non-zero angle with respect to vertical dimension Z, as indicated by angled arrow 146. The exiting air may then flow horizontally, parallel with the surface of external support structure 130, as indicated by arrow 148.

With the air flow configuration of FIG. 13, air may initially flow vertically upwards to cool circuitry such as integrated circuits and other components 62 on printed circuit board 60 and to cool hard disk drive. After flowing briefly in a horizontal direction, as indicated by arrow 148, power supply 54 may be cooled by directing the air to flow vertically downwards. This type of up and over air flow configuration may help cool device 10 efficiently, even in configurations in which the vertical size of device 10 is larger than its horizontal size.

Electrical components in device 10 such as wireless circuitry 34 (e.g., components 62 on printed circuit 60) may be sensitive to electromagnetic noise. During operation, hard disk drive 44 may generate electromagnetic noise. Shielding structures such as shielding structures 150 that surround hard disk drive 44 may be incorporated into device 10 to prevent this noise from interfering with the operation of circuitry 62 on printed circuit board 60.

Figure 14:
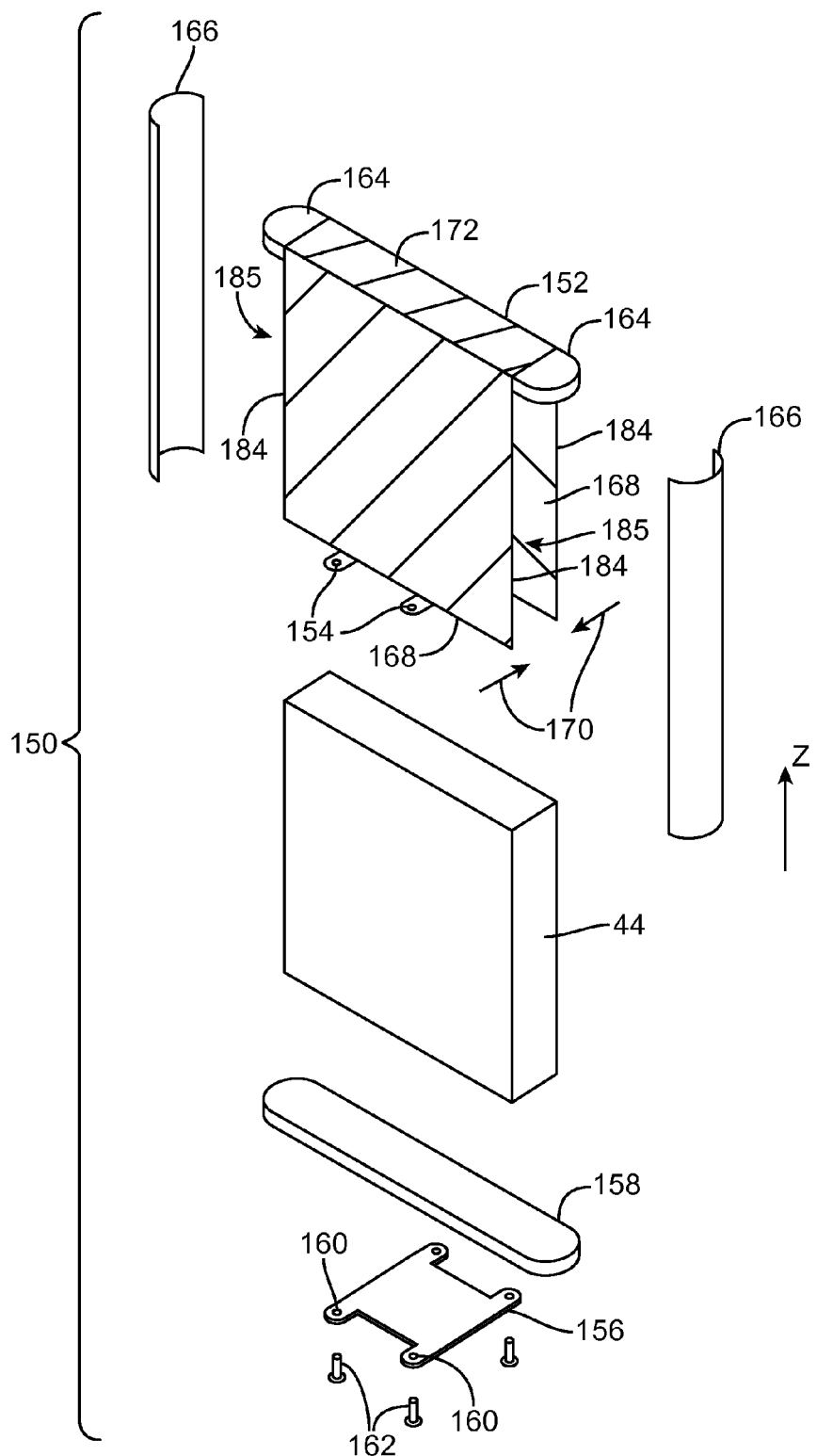
FIG. 14 is an exploded perspective view of electromagnetic interference shielding structures that may be used in mounting and shielding an electrical component such as a hard disk drive or other storage drive within the interior of an electronic device in accordance with an embodiment.

Illustrative shielding structures 150 that may be used in shielding an electronic component such as hard disk drive 44 are shown in the exploded perspective view of FIG. 14. As shown in FIG. 14, shielding structures 150 may include a metal bracket such as bracket 152. During assembly, sides 168 of bracket 152 may be pinched inwards in directions 170 to temporarily reduce the lateral dimensions of bracket 152 and thereby provide clearance with respect to other device structures. After bracket 152 has been mounted within device housing 12, sides 168 may expand outward to accommodate insertion of hard disk drive 44.

As shown in FIG. 14, bracket 152 has opposing open ends 185. When assembled into device 10, shielding structures 150 may form a six-sided conductive box that shields all six sides of hard disk drive 44. Bracket 152 has two vertically extending main sides 168 that form a main pair of vertical sides for the shielding box. Upper planar portion 172 of bracket 152 and protruding portions of upper elastomeric bumper 164 form the uppermost side of the shielding box. An opposing lower side of the shielding box is formed by lower elastomeric bumper 158. Curved sheet metal end shields 166 form closed conductive sides that cover the open ends 185 of metal bracket 152.

End shields 166 may be mounted to the interior of housing 12 (e.g., on curved inner surfaces of plastic portions of housing 12). Bumper 164 may be used with upper side 172 of bracket 152 in forming the upper side of the six-sided conductive box. Bumper 158 may be used in forming the lower side of the six-sided conductive shielding box. Bumpers 164 and 158 may have rounded ends that mate with rounded surfaces along the upper and lower edges of end shields 166. The use of a soft material in forming bumpers 164 and 158 (i.e., a material that is softer than end shields 166) may help bumpers 164 and 158 form a tight seal when pressed against end shields 166. Soft elastomeric bumpers may also help prevent damage to hard drive 44 in the event of an impact to device 10 and may help reduce vibrations during use.

A metal structure such as base plate 156 may be used in attaching elastomeric bumper 158 to the bottom of shielding structures 150. Screws 162 may pass through openings 160 in base plate 156 and may be received in corresponding openings 154 in tabs protruding from the lower edges of sidewalls 168 of bracket 152.

Figure 15:
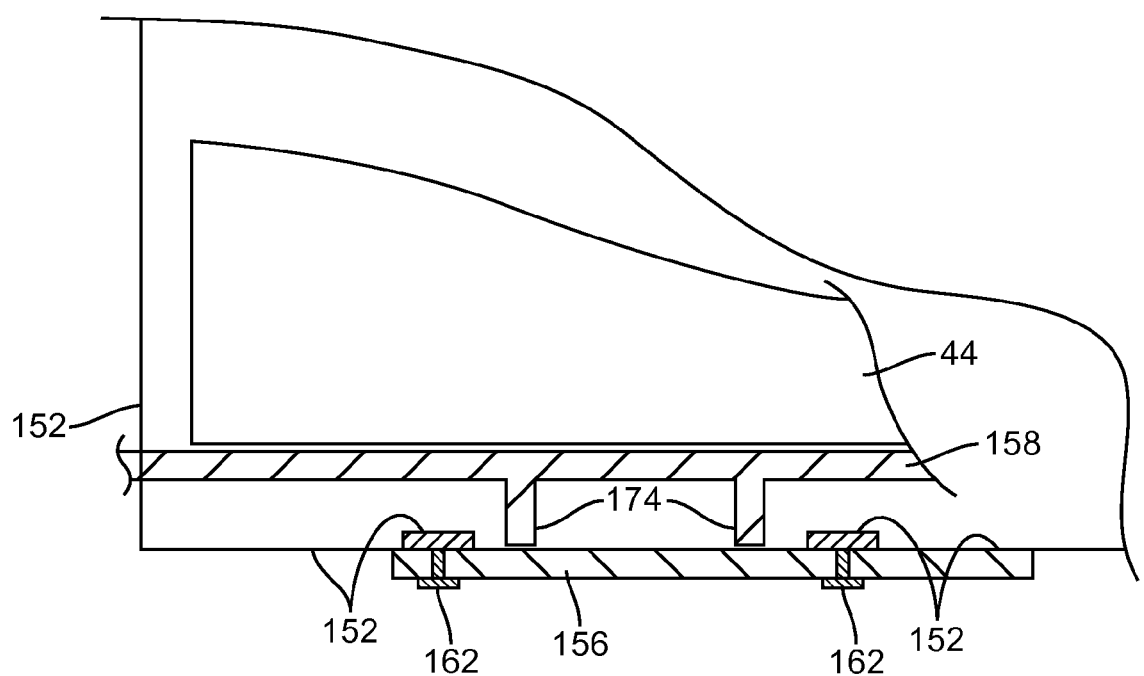
FIG. 15 is a cross-sectional side view of a portion of an electronic device shielding and component mounting structure showing how a hard disk drive may be mounted within a metal bracket using a conductive elastomeric member that performs electromagnetic shielding functions in accordance with an embodiment.

FIG. 15 is a cross-sectional side view of a lower portion of shielding structures 150. As shown in FIG. 15, lower elastomeric bumper 158 may be provided with downwardly directed protrusions such as protrusions 174. Protrusions 154 may serve as supporting feet that help cushion hard drive 44 from vibrations (e.g., vibrations when device 10 is exposed to an impact or vibrations that originate from moving parts within device 10 such as disk drive 44 or fan 56). As shown in FIG. 15, screws 162 may be used in securing base plate 156 to bracket 152. Base plate 156 may hold lower elastomeric bumper 158 in place to form the lower surface of box-shaped shielding structures 150.

Metal bracket 152 and end shields 166 may be formed from metals such as copper, aluminum, stainless steel, or other metals (as an example). Bumpers such as bumpers 164 and bumper 158 may be formed from elastomeric materials such as soft polymeric materials. The polymer used to form bumpers 164 and 158 may be sufficiently flexible to allow bumpers 164 and 158 to conform to mating metal structures such as structures 166, thereby helping to form tight seals between the structures that make up shielding structures 150. The use of flexible elastomeric materials as part of shielding structures 150 may also help absorb vibrations that might be produce by moving parts in device 10 such as fan 56 and hard drive 44. Elastomeric structures such as bumpers 158 and 164 may also help absorb shocks that may arise during impact events.

The use of elastomeric bumpers 158 and 164 may provide protection for hard drive 44 in the event that device 10 is tipped over accidentally by a user. Protection for hard drive 44 may also be provided through the use of an accelerometer based read-write head parking function or other function that raises the read-write head(s) of drive 44 above the spinning platters in drive 44. During operation, control circuitry 42 may make accelerometer readings using accelerometer 46. If acceleration data exceeding a predetermined threshold is detected, control circuitry 42 may direct hard drive 44 to park or otherwise move the read-write heads within hard drive 44 to prevent potential disk damage from shocks experienced during the tip event.

Figure 16:
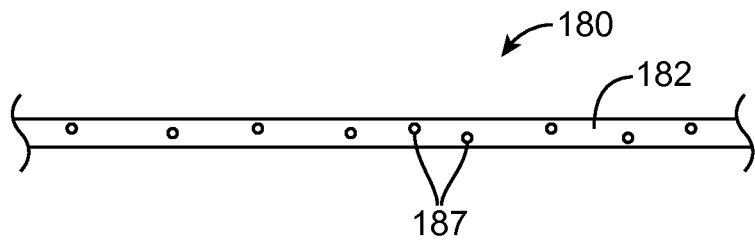
FIG. 16 is a cross-sectional side view of a portion of an illustrative conductive elastomeric shielding member formed from elastomeric material filled with conductive particles in accordance with an embodiment.

To ensure that electromagnetic interference is shielded satisfactorily by shielding structures 150, elastomeric bumper structures 158 and 164 may be conductive. As shown in FIG. 16, for example, elastomeric bumper structures 180 (e.g., structures 158 and/or 152) may be formed from elastomeric material 182 containing conductive filler particles 187. Particles 187 may be, for example, metal particles. Elastomeric material 182 may be a soft polymer.

Figure 17:
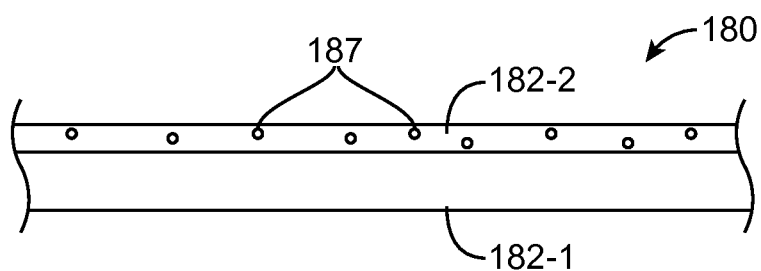
FIG. 17 is a cross-sectional side view of a portion of an illustrative conductive elastomeric shielding member formed from two shots of plastic such as a first shot of elastomeric polymer that is free of conductive particles and a second shot of elastomeric polymer filled with conductive particles in accordance with an embodiment.

In the FIG. 17 example, elastomeric material 182-1 (e.g., a soft polymer) is being used as a support structure for a layer of metal-filled polymer such as layer 182-2. Elastomeric material 182-1 may be formed as a first injection molded shot of material and elastomeric material 182-2 may be formed as a second injection molded shot of material. Metal particles 187 may be incorporated into the second shot of plastic (i.e., in elastomeric material 182-2) to ensure that the second shot of plastic and therefor structures 180 are sufficiently conductive to serve as a part of electromagnetic interference shielding structures 150.

Figure 18:
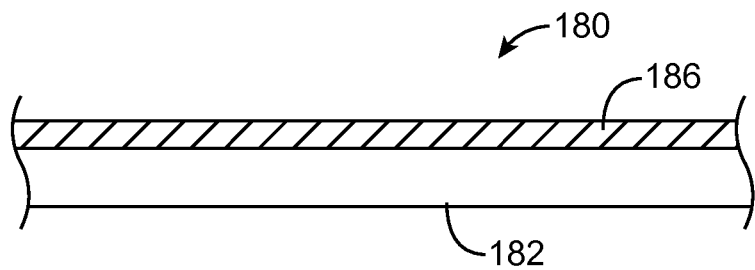
FIG. 18 is a cross-sectional side view of a portion of an illustrative conductive elastomeric shielding member formed from elastomeric material covered with a layer of metal in accordance with an embodiment.

If desired, metal coatings, metal foil, sheet metal parts, or other metal structures may be added to structures 182 to provide shielding. This type of arrangement is shown in FIG. 18. As shown in the example of FIG. 18, structures 180 may have elastomeric material 182. Metal layer 186 may be attached to elastomeric material 182 to form shielding elastomeric structures 180. Metal layer 186 may be a coating of metal that is deposited in the form of metal paint, using physical vapor deposition, using electroplating, or using other deposition techniques or meta layer 186 may be a layer of metal foil or sheet metal that is attached to elastomeric material 182 (e.g., using adhesive or other attachment mechanisms).

The configurations of FIGS. 16, 17, and 18 are merely illustrative. Any suitable conductive materials may be used in forming the upper and lower walls of shielding structures 150 if desired.

Conductive gaskets such as conductive fabric-over-foam gaskets or other conductive gaskets (e.g., gaskets formed exclusively from conductive fabric tubes, gaskets formed exclusively from conductive foam, or other gaskets that can be compressed between conductive parts at a joint) may be used in forming joints between different portions of shielding structures 150. As an example, elongated strip-shaped conductive gaskets may run vertically, parallel to dimension Z, along vertically extending edges 184 of sidewalls 168 at open ends 185 of bracket 152 to help seal bracket 152 to end shields 166.

Figure 19:
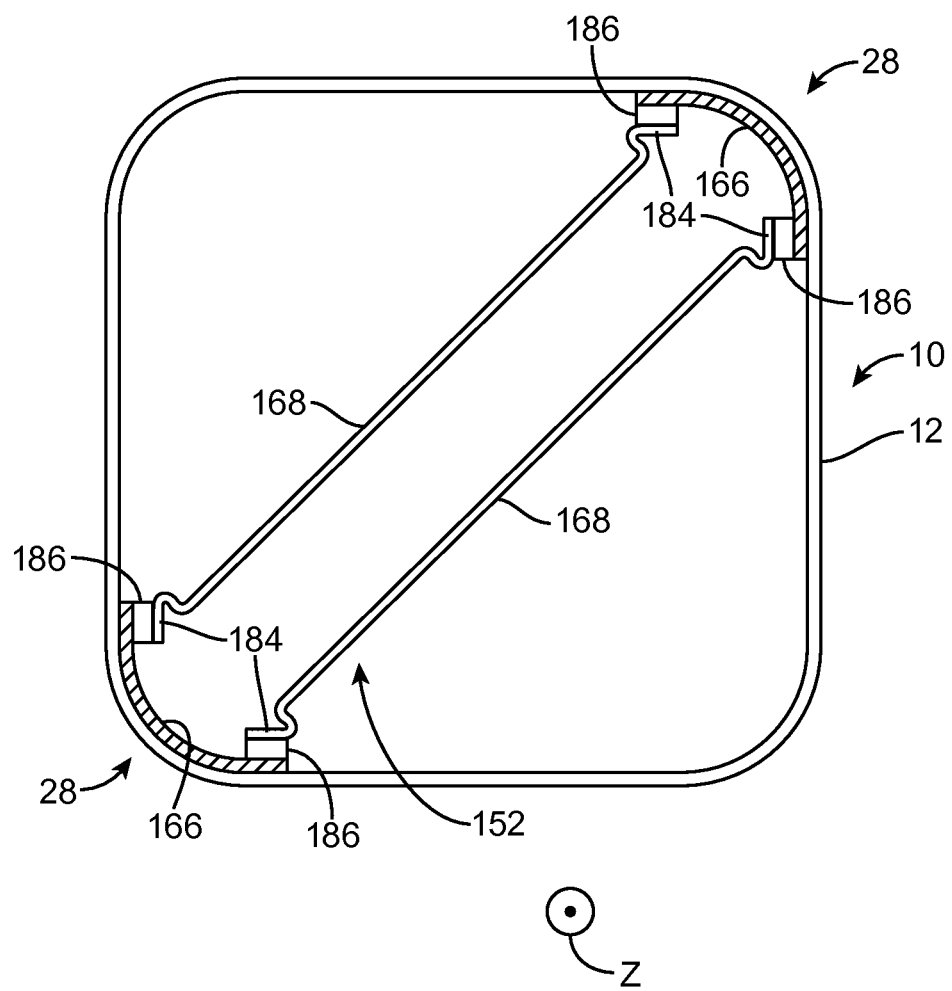
FIG. 19 is a cross-sectional top view of an electronic device with illustrative shielding structures in accordance with an embodiment.

FIG. 19 is a cross-sectional top view of device 10 showing illustrative locations for conductive gaskets 186 on edges 184 of sidewalls 168 of bracket 152. Gaskets 186 may have the shape of elongated strips that extend vertically in dimension Z (into the page in the orientation of FIG. 19). As shown in FIG. 19, gaskets 186 may form shield joints between edges 184 of bracket 152 and corresponding edge portions of end shields 166. End shields 166 may be formed from rectangular sheet metal parts that are attached to the curved inner surfaces of curved edges 28 of housing 12 (e.g., using adhesive or other attachment mechanisms).

Figure 20:
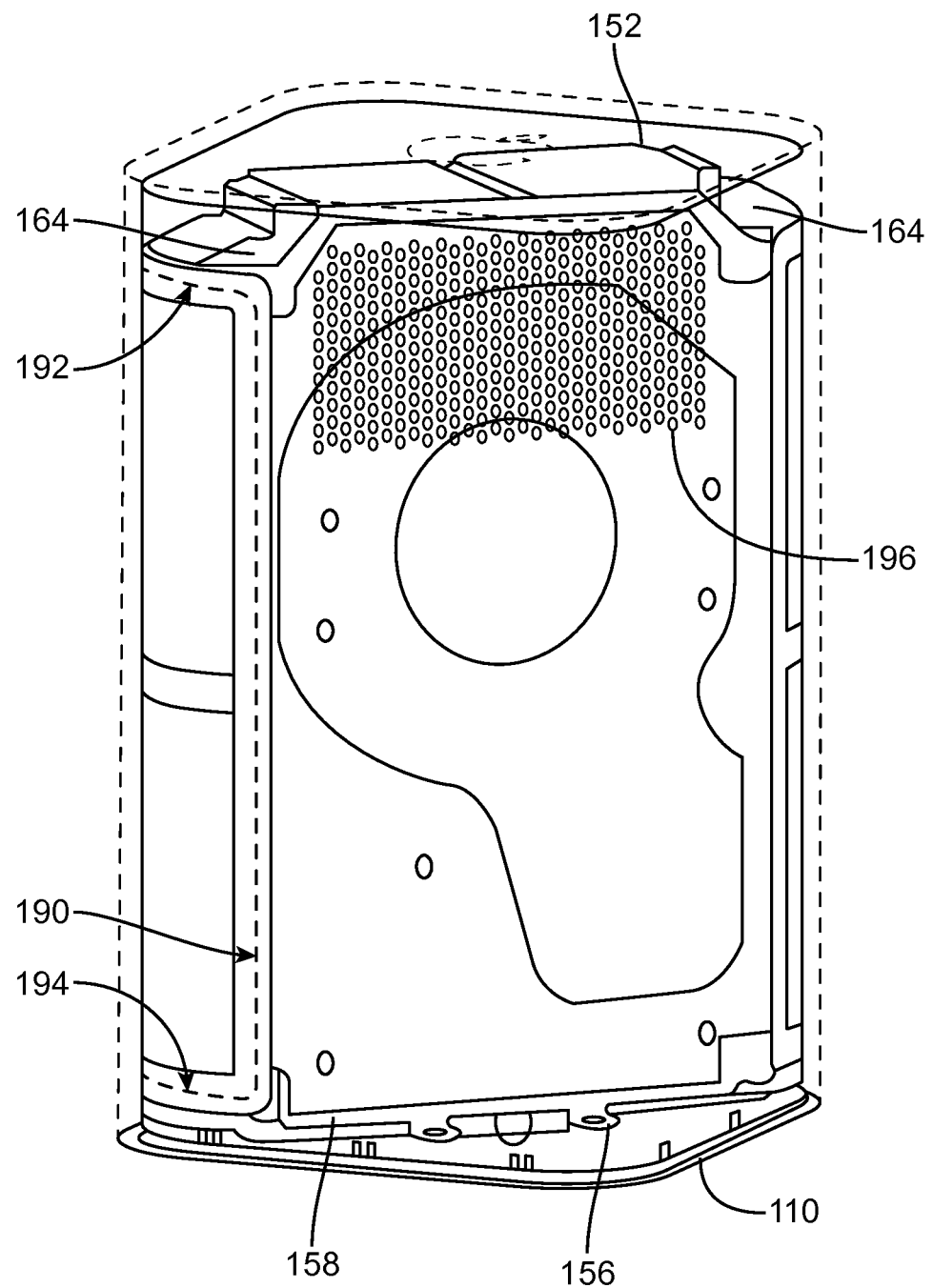
FIG. 20 is a perspective view of an interior portion of an illustrative electronic device having shielding structures configured to shield and support a structure such as a hard disk drive in accordance with an embodiment.

FIG. 20 is perspective view of an interior portion of device 10. Vertical dashed line 190 shows where gasket 186 may contact end shield 166. Upper horizontal line 192 shows where upper conductive bumper 164 may contact end shield 166. Lower horizontal line 194 shows where lower conductive bumper 158 may contact end shield 166. Metal bracket 152 may have openings such as perforations 196. Perforations 196 allow air to flow horizontally along the upper portion of the interior of housing 12 (i.e., when traveling from heat sink structures 66 to fan 56, as shown in FIG. 13).

Figure 21:
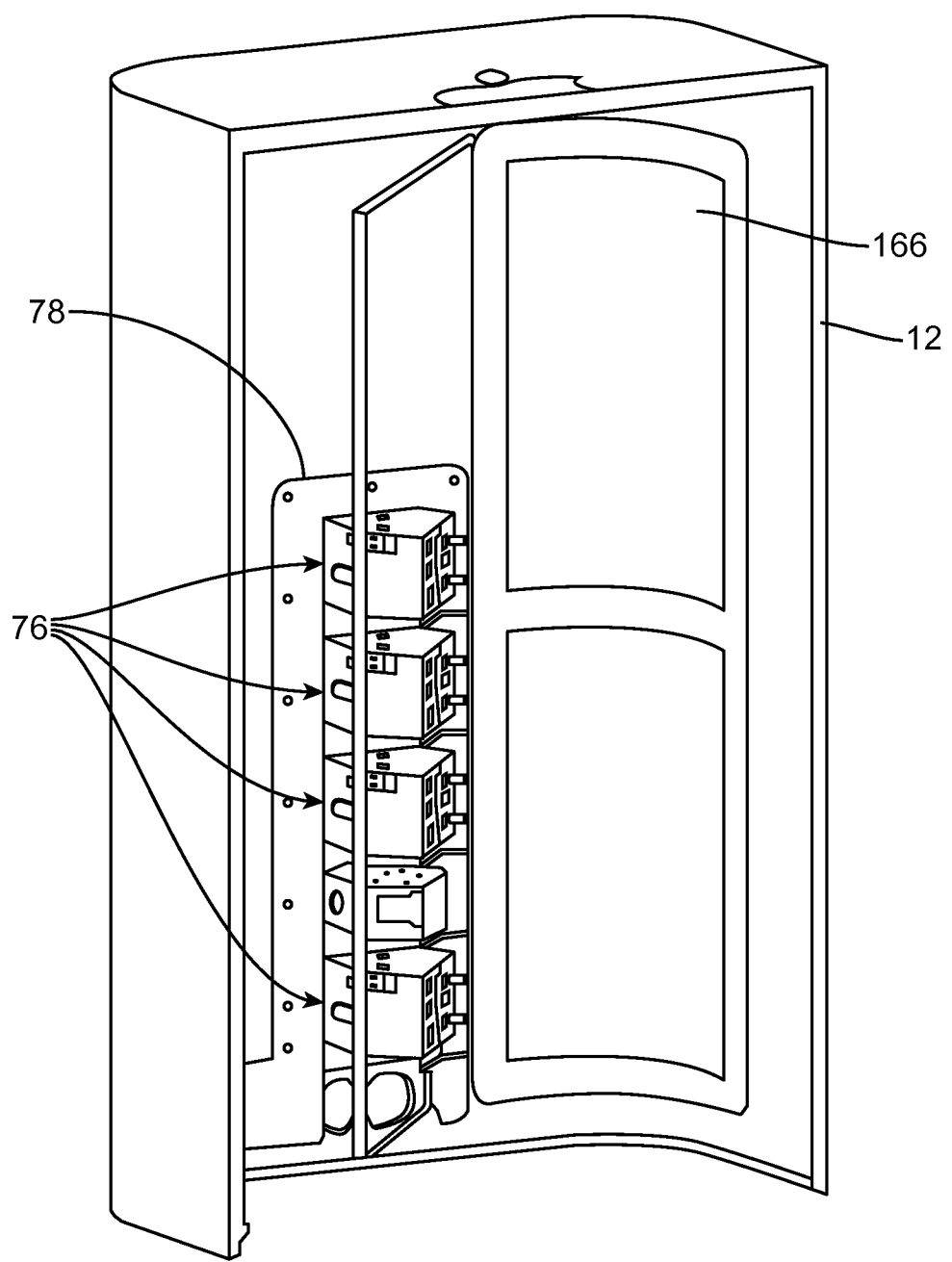
FIG. 21 is a perspective view of an interior portion of an illustrative electronic device having sheet metal shielding structures mounted to a curved inner surface of a device housing in accordance with an embodiment.

FIG. 21 is an interior view of a portion of device 10 and housing 12 showing how end shield 166 may be attached to a curved inner surface of housing 12. Connectors 76 may be mounted in a row that runs vertically adjacent to the edge of end shield 166.

Figure 22:
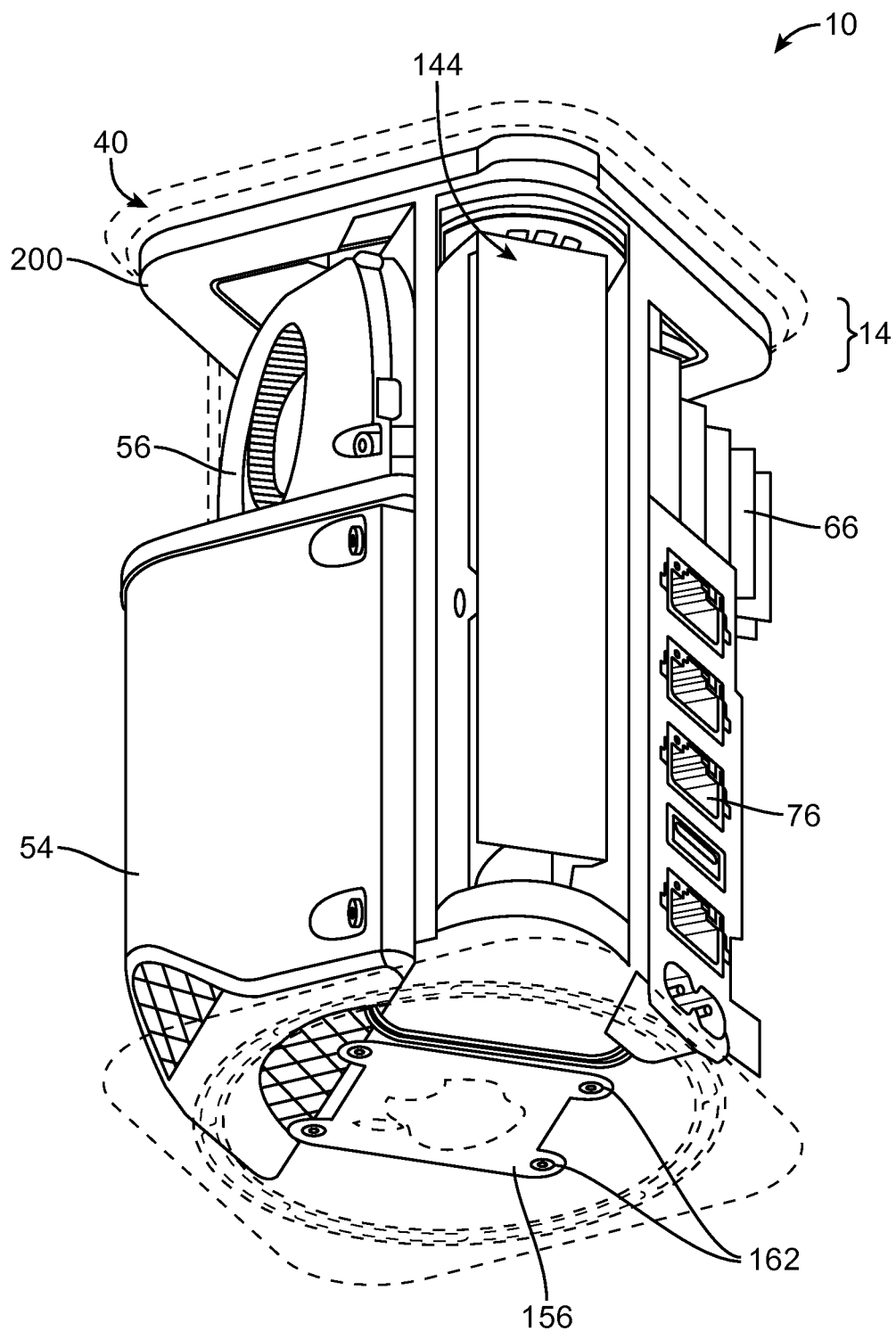
FIG. 22 is a perspective view of an interior portion of an illustrative electronic device in accordance with an embodiment.

As shown in the perspective view of interior portions of device 10 in FIG. 22, base plate 156 and screws 162 may be used to mount conductive elastomeric lower bumper 158 in device 10. Power supply 54 is mounted adjacent to fan 56, so that fan 56 can blow air through power supply 54. Antenna structures 40 may be formed in upper region 14 of device 10 above hard drive 44 and below the upper surface of housing 12. Antenna structures 40 may include a plastic support structure such as support structure 200.

Figure 23:
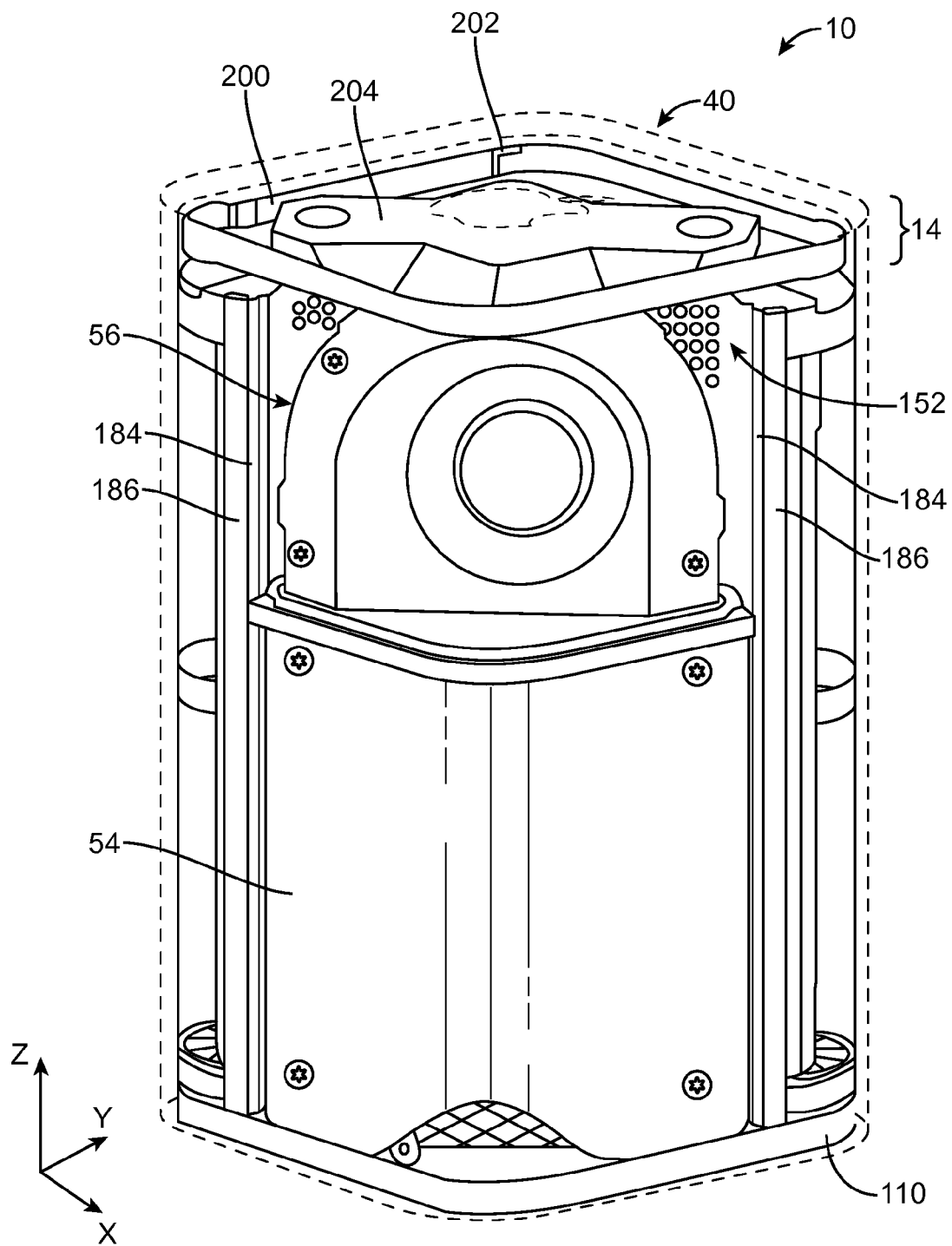
FIG. 23 is a perspective view of an interior portion of an illustrative electronic device showing how a fan may be mounted above a power supply in accordance with an embodiment.

As shown in FIG. 23, metal antenna traces 202 for antennas 40 may be formed on plastic support structure 200. Stamped metal can 204 or other conductive structures may form an antenna ground for antennas 40.

Conductive gaskets 186 may be formed from elongated strip-shaped members that run vertically along edges 184 of metal bracket 152. Housing support structures 110 may be located at the base of device 10 to support device 10.

Figure 24:
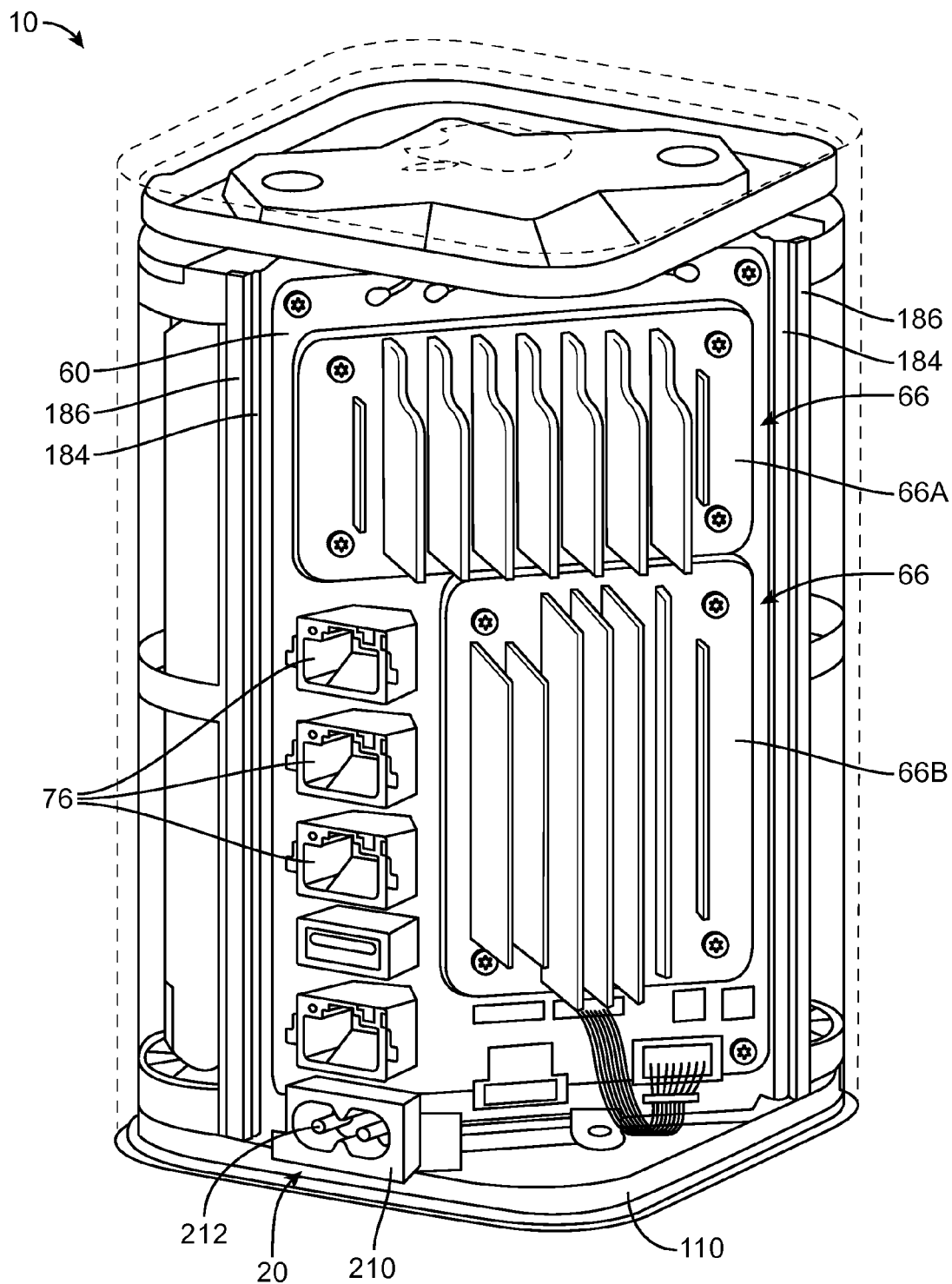
FIG. 24 is a perspective view of an interior portion of an illustrative electronic device with heat sink structures and input-output connector structures in accordance with an embodiment.

In the orientation of FIG. 23, conductive gaskets 186 are attached to the side of bracket 152 that faces fan 56 and power supply 54. In the orientation of FIG. 24, conductive gaskets 186 are shown that are attached to the side of bracket 152 that faces printed circuit board 60. Heat sink structures 66 may include an upper heat sink 66A and a lower heat sink 66B or other structures for dissipating heat. Lower heat sink 66B may have a smaller width than upper heat sink structures 66 to accommodate connectors 76. Housing support structures 110 may be located at the base of device 10. Power port 20 may be located near the base of device 10 and support structures 110, so that device 10 is not easily tipped over in the event that a power cord is inadvertently pulled.

Power port 20 may include inner power connector structure 210 and power pins 212. Inner power connector structure 210 may be formed from a dielectric such as injection molded plastic and may be used to support power pins 212. An outwardly facing cavity in structure 210 may be configured to receive a power plug.

Figure 25:
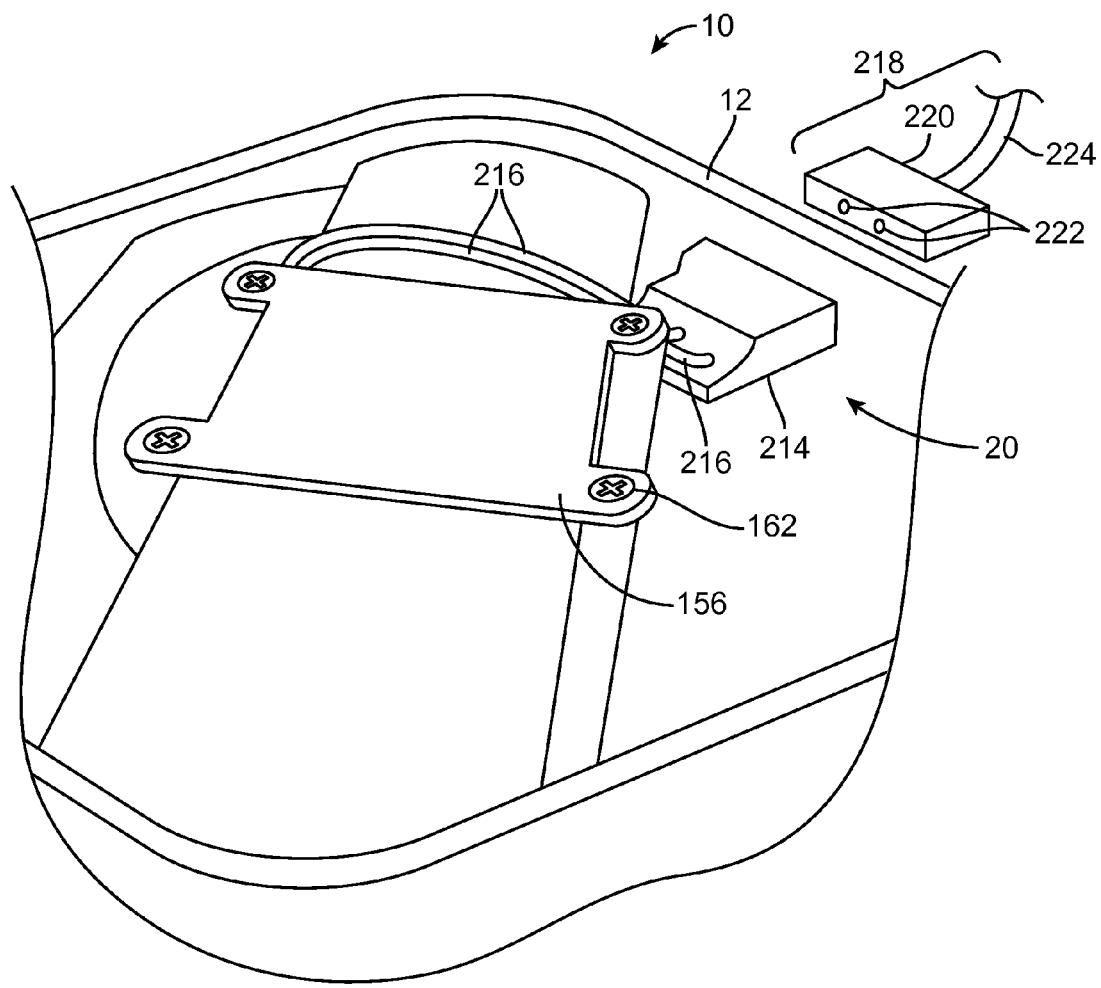
FIG. 25 is a bottom perspective view of an interior portion of an illustrative electronic device having an alternating current connector in accordance with an embodiment.

FIG. 25 is a perspective view of a bottom interior portion of device 10 in the vicinity of power port 20. To help provide electrical isolation, an outer shell such as shell 214 may be used to cover inner connector structure 210. Outer shell 214 may be formed from a dielectric such as plastic. Power wires 216 may be used to route alternating current power from port 20 to power supply 54. Wires 216 may run past the edge of base plate 156, which is mounted to device 10 using screws 162.

Power port 20 may be coupled to an external power cable such as cable 218 to receive power from an alternating current (AC) wall outlet or other source of alternating current or direct current power. Cable 218 may include wires in a length of cable 224 that is terminated with connector 220. Connector 220 may have a plastic housing in which power pins 222 are mounted. Power pins 222 may electrically connect to respective power pins 212 (FIG. 24) in port 20 when cable 218 is mated with device 10.

Figure 26:
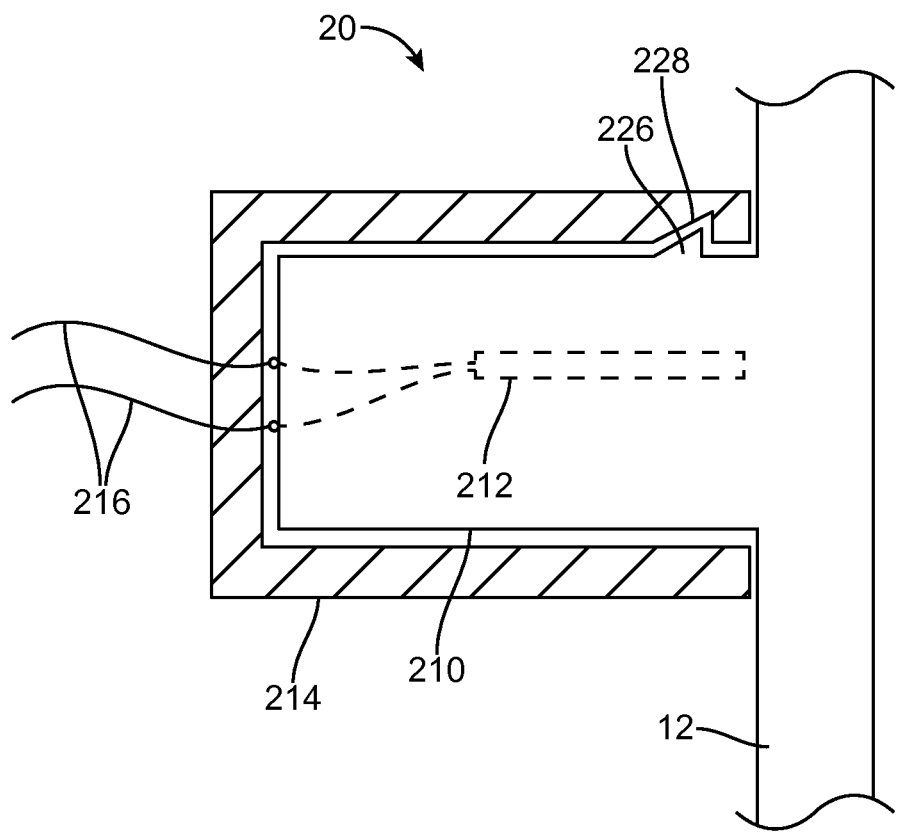
FIG. 26 is a cross-sectional side view of the alternating current connector of FIG. 25 showing how a two-piece connector housing may be used in forming the connector in accordance with an embodiment.

A cross-sectional side view of the structures associated with power port 20 is shown in FIG. 26. As shown in FIG. 26, inner connector structure 210 may have an engagement feature such as angled protrusion 226 that mates with a corresponding recess or other engagement feature such as notch 228 in outer power connector shell 214. During assembly, shell 214 may slide over the exterior of inner power connector structure until engagement features 226 and 228 engage with one another to hold shell 214 in place over interior connector structure 210. The use of multiple layers of plastic in forming connector port 20 helps electrically isolate power pins 212 from circuitry within device 10.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
  a housing;
  a hard disk drive mounted in the housing; and
  electromagnetic interference shielding structures surrounding the hard disk drive, wherein the electromagnetic interference shielding structures include a metal bracket having opposing open ends and end shields that cover the opposing ends, and wherein the end shields are mounted to inner surfaces of the housing such that the end shields are substantially enclosed within the housing.

2. The electronic device defined in claim 1 wherein the metal bracket has edges at the open ends, the electronic device further comprising conductive gaskets that run along the edges between the metal bracket and the end shields.

3. The electronic device defined in claim 1 wherein the electromagnetic interference shielding structures comprise conductive elastomeric structures.

4. The electronic device defined in claim 3 wherein the conductive elastomeric structures include a lower bumper that forms a lower side of the electromagnetic interference shielding structures under the hard disk drive.

5. The electronic device defined in claim 4 wherein the lower bumper has ends that press against the end shields.

6. The electronic device defined in claim 5 wherein the ends comprise rounded ends and wherein the end shields are formed from curved sheet metal that mates with the rounded ends of the lower bumper.

7. The electronic device defined in claim 6 wherein the conductive elastomeric structures include an upper bumper that mates with the curved sheet metal.

8. The electronic device defined in claim 1 wherein the inner surfaces comprise curved inner surfaces and wherein the end shields comprise metal on the curved inner surfaces.

9. The electronic device defined in claim 8 further comprising a conductive elastomeric structure and a metal plate that attaches the conductive elastomeric structures to the metal bracket.

10. The electronic device defined in claim 1 wherein the housing comprises a box-shaped housing having diagonally opposed edges and wherein the electronic device further comprises a printed circuit board that extends diagonally across the box-shaped housing between the diagonally opposed edges.

11. The electronic device defined in claim 10 wherein the housing has an inner surface, the electronic device further comprising input-output connectors mounted to the printed circuit board, wherein the input-output connectors have surfaces that lie against the inner surface of the housing.

* * * * *